(12) United States Patent
Kamimura

(10) Patent No.: US 12,235,584 B2
(45) Date of Patent: Feb. 25, 2025

(54) CHEMICAL LIQUID, CHEMICAL LIQUID STORAGE BODY, RESIST PATTERN FORMING METHOD, AND SEMICONDUCTOR CHIP MANUFACTURING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 823 days.

(21) Appl. No.: 17/219,805

(22) Filed: Mar. 31, 2021

(65) Prior Publication Data

US 2021/0223698 A1    Jul. 22, 2021

Related U.S. Application Data

(63) Continuation of application No. PCT/JP2019/034756, filed on Sep. 4, 2019.

(30) Foreign Application Priority Data

Oct. 3, 2018 (JP) ................. 2018-188517

(51) Int. Cl.
G03F 7/32 (2006.01)
B65D 1/02 (2006.01)
G03F 7/42 (2006.01)

(52) U.S. Cl.
CPC .............. *G03F 7/325* (2013.01); *G03F 7/422* (2013.01); *B65D 1/0207* (2013.01)

(58) Field of Classification Search
None
See application file for complete search history.

(56) References Cited

U.S. PATENT DOCUMENTS

| | | | |
|---|---|---|---|
| 5,426,199 | A | 6/1995 | Lundquist |
| 8,864,894 | B2 | 10/2014 | Shibayama et al. |
| 9,760,006 | B2 | 9/2017 | Nakajima et al. |
| 10,663,864 | B2 | 5/2020 | Nihashi et al. |
| 10,761,426 | B2 | 9/2020 | Tsubaki et al. |
| 10,884,338 | B2 | 1/2021 | Kamimura |
| 11,022,884 | B2 | 6/2021 | Shibayama et al. |
| 11,079,677 | B2 | 8/2021 | Kamimura |
| 11,360,389 | B2 * | 6/2022 | Kamimura ............. G03F 7/16 |
| 11,740,557 | B2 | 8/2023 | Kamimura et al. |
| 11,747,727 | B2 | 9/2023 | Kamimura et al. |
| 2011/0190464 | A1 | 8/2011 | Dubois et al. |
| 2019/0025701 | A1 | 1/2019 | Kamimura |
| 2019/0060782 | A1 * | 2/2019 | Shimizu ............. B01D 3/00 |
| 2019/0227435 | A1 | 7/2019 | Kamimura |
| 2023/0350290 | A1 | 11/2023 | Kamimura et al. |

FOREIGN PATENT DOCUMENTS

| | | | |
|---|---|---|---|
| CN | 101910949 | 12/2010 | |
| CN | 102124064 | 7/2011 | |
| CN | 106662820 | 5/2017 | |
| JP | H05246947 | 9/1993 | |
| JP | 2014205668 | 10/2014 | |
| JP | 2015084122 | 4/2015 | |
| KR | 20130103639 | 9/2013 | |
| TW | 201712432 | 4/2017 | |
| TW | 201712445 | 4/2017 | |
| TW | 201814406 | 4/2018 | |
| WO | 2017002497 | 1/2017 | |
| WO | 2017099121 | 6/2017 | |
| WO | 2017169833 | 10/2017 | |
| WO | 2017188209 | 11/2017 | |
| WO | WO-2017188209 A1 * | 11/2017 | ............. B01D 3/00 |
| WO | 2018061485 | 4/2018 | |
| WO | 2018062471 | 4/2018 | |
| WO | WO-2018061573 A1 * | 4/2018 | ............ B65D 88/06 |
| WO | 2018092763 | 5/2018 | |
| WO | 2018151164 | 8/2018 | |

OTHER PUBLICATIONS

Cheung, H., Tanke, R.S. and Torrence, G.P. (2000). Acetic Acid. In Ullmann's Encyclopedia of Industrial Chemistry, (Ed.). (Year: 2000).*
N-butyl Acetate, ACS, Technical Data Sheet, published Nov. 15, 2013 (Year: 2013).*
"Office Action of Japan Counterpart Application" with English translation thereof, issued on Apr. 5, 2022, p. 1-p. 12.
"International Search Report (Form PCT/ISA/210) of PCT/JP2019/034756," mailed on Dec. 10, 2019, with English translation thereof, pp. 1-5.
"Written Opinion of the International Searching Authority (Form PCT/ISA/237) of PCT/JP2019/034756," mailed on Dec. 10, 2019, with English translation thereof, pp. 1-12.
"Office Action of Korea Counterpart Application", issued on Aug. 23, 2023, with English translation thereof, p. 1-p. 9.
"Office Action of Taiwan Counterpart Application", issued on Feb. 8, 2023, with partial English translation thereof, p. 1-p. 15.
"Office Action of Korea Counterpart Application", issued on Apr. 18, 2023, with English translation thereof, p. 1-p. 12.

(Continued)

*Primary Examiner* — Sean M DeGuire
*Assistant Examiner* — Andrew Preston Traywick
(74) *Attorney, Agent, or Firm* — JCIPRNET

(57) ABSTRACT

The present invention provides a chemical liquid which makes it possible to obtain a resist pattern while inhibiting pattern interval variation in a case where the chemical liquid is used as a developer or rinsing solution. The present invention also provides a chemical liquid storage body, a resist pattern forming method, and a semiconductor chip manufacturing method. The chemical liquid according to an embodiment of the present invention is a chemical liquid containing n-butyl acetate and isobutyl acetate, in which a content of the n-butyl acetate is 99.000% to 99.999% by mass with respect to a total mass of the chemical liquid, and a content of the isobutyl acetate is 1.0 to 1,000 mass ppm with respect to the total mass of the chemical liquid.

22 Claims, No Drawings

(56) References Cited

OTHER PUBLICATIONS

"Office Action of Israel Counterpart Application", issued on Aug. 13, 2023, p. 1-p. 3.
"Office Action of China Counterpart Application", issued on Jan. 20, 2024, with English translation thereof, p. 1-p. 13.
"Office Action of Japan Counterpart Application", issued on Mar. 5, 2024, with English translation thereof, p. 1-p. 9.
"Search Report of Europe Counterpart Application", issued on Oct. 1, 2021, pp. 1-13.
Panreac Applichem ITW Reagents, "Product code 131202", Nov. 2013, pp. 1-3.

* cited by examiner

CHEMICAL LIQUID, CHEMICAL LIQUID STORAGE BODY, RESIST PATTERN FORMING METHOD, AND SEMICONDUCTOR CHIP MANUFACTURING METHOD

CROSS-REFERENCE TO RELATED APPLICATIONS

This application is a Continuation of PCT International Application No. PCT/JP2019/034756 filed on Sep. 4, 2019, which claims priority under 35 U.S.C. § 119(a) to Japanese Patent Application No. 2018-188517 filed on Oct. 3, 2018. The above application is hereby expressly incorporated by reference, in its entirety, into the present application.

BACKGROUND OF THE INVENTION

1. Field of the Invention

The present invention relates to a chemical liquid, a chemical liquid storage body, a resist pattern forming method, and a semiconductor chip manufacturing method.

2. Description of the Related Art

In a case where semiconductor devices are manufactured by a wiring forming process including photolithography, as a treatment liquid such as a developer or a rinsing solution, a chemical liquid containing water and/or an organic solvent is used.

Regarding the conventional chemical liquid used in forming a resist pattern, JP2015-084122A discloses "method for manufacturing an organic treatment liquid for patterning a chemically amplified resist film, the organic treatment liquid capable of suppressing the occurrence of particles in pattern forming technology (paragraph "0010")". JP2015-084122A discloses an aspect in which the organic treatment liquid is used as a developer or a rinsing solution.

SUMMARY OF THE INVENTION

In recent years, with the advancement of photolithography technology, miniaturization has progressed, and the resist patterns used in manufacturing semiconductor devices have been required to have a higher resolution.

The inventors of the present invention formed a resist pattern by using n-butyl acetate specifically described in JP2015-084122A. As a result, the inventors have found that the level of a pattern interval variation in the formed resist pattern is higher than the currently required level and needs to be further improved. The pattern interval means an interval between linear patterns at which a plurality of linear patterns is formed.

An object of the present invention is to provide a chemical liquid which makes it possible to form a resist pattern while inhibiting pattern interval variation in a case where the chemical liquid is used as a developer or rinsing solution.

Another object of the present invention is to provide a chemical liquid storage body, a resist pattern forming method, and a semiconductor chip manufacturing method.

In order to achieve the above objects, the inventors of the present invention conducted intensive studies. As a result, the inventors have found that the objects can be achieved by the following constitutions.

(1) A chemical liquid containing n-butyl acetate and isobutyl acetate, in which a content of the n-butyl acetate is 99.000% to 99.999% by mass with respect to a total mass of the chemical liquid, and a content of the isobutyl acetate is 1.0 to 1,000 mass ppm with respect to the total mass of the chemical liquid.

(2) The chemical liquid described in (1), further containing pentyl acetates, in which a content of the pentyl acetates is 1.0 to 300 mass ppm with respect to the total mass of the chemical liquid.

(3) The chemical liquid described in (2), in which the pentyl acetates contain a compound selected from the group consisting of 1-methylbutyl acetate, 2-methylbutyl acetate, and 3-methylbutyl acetate.

(4) The chemical liquid described in (2) or (3), in which a mass ratio of the content of the isobutyl acetate to the content of the pentyl acetates is 0.5 to 300.

(5) The chemical liquid described in any one of (1) to (4), further containing propionic acid butyl ester, in which a content of the propionic acid butyl ester is 1.0 to 700 mass ppm with respect to the total mass of the chemical liquid.

(6) The chemical liquid described in (5), further containing pentyl acetates, in which a mass ratio of the content of the propionic acid butyl ester to a content of the pentyl acetates is 0.10 to 10.0.

(7) The chemical liquid described in any one of (1) to (6), further containing butyl formate, in which a content of the butyl formate is 1.0 to 50 mass ppm with respect to the total mass of the chemical liquid.

(8) The chemical liquid described in any one of (1) to (7), further containing dibutyl ether, in which a content of the dibutyl ether is 5.0 to 500 mass ppm with respect to the total mass of the chemical liquid.

(9) The chemical liquid described in (8), further containing pentyl acetates, in which a mass ratio of the content of the dibutyl ether to a content of the pentyl acetates is higher than 0.5 and equal to or lower than 35.0.

(10) The chemical liquid described in any one of (1) to (9), further containing 1-butanol, in which a content of the 1-butanol is 5.0 to 3,500 mass ppm with respect to the total mass of the chemical liquid.

(11) The chemical liquid described in any one of (1) to (10), further containing a sulfate ion, in which a content of the sulfate ion is 1.0 to 200 mass ppm with respect to the total mass of the chemical liquid.

(12) The chemical liquid described in (11), further containing pentyl acetates, in which a mass ratio of the content of the sulfate ion to a content of the pentyl acetates is 0.01 to 10.0.

(13) The chemical liquid described in any one of (1) to (12), further containing a metal component, in which a content of the metal component is 0.01 to 150 mass ppt with respect to the total mass of the chemical liquid.

(14) The chemical liquid described in (13), in which a mass ratio of the content of the isobutyl acetate to the content of the metal component is $10^4$ to $10^7$.

(15) The chemical liquid described in any one of (1) to (14), further containing a sulfate ion and a metal component, in which a mass ratio of a content of the sulfate ion to a content of the metal component is $10^4$ to $10^8$.

(16) The chemical liquid described in any one of (1) to (15), which is used as a developer or a rinsing solution.

(17) A chemical liquid storage body including a container and the chemical liquid described in any one of (1) to (16) that is stored in the container.

(18) The chemical liquid storage body described in (17), in which a liquid contact portion coming into contact with the chemical liquid in the container is formed of electropolished stainless steel or a fluororesin.

(19) The chemical liquid storage body described in (17) or (18), in which a void volume in the container determined by Equation (1) which will be described later is 5% to 30% by volume.
(20) A resist pattern forming method, including a step of forming a coating film on a substrate by using an actinic ray-sensitive or radiation-sensitive resin composition, a step of exposing the coating film, and a step of forming a resist pattern by developing the exposed coating film by using a developer, in which the developer is the chemical liquid described in any one of (1) to (16).
(21) A resist pattern forming method including a step of forming a coating film on a substrate by using an actinic ray-sensitive or radiation-sensitive resin composition, a step of exposing the coating film, a step of forming a resist pattern by developing the exposed coating film by using a developer, and a step of washing the resist pattern by using a rinsing solution, in which the rinsing solution is the chemical liquid described in any one of (1) to (16).
(22) A semiconductor chip manufacturing method including the resist pattern forming method described in (20) or (21).
(23) A chemical liquid containing n-butyl acetate, isobutyl acetate, and a metal component, in which a content of the n-butyl acetate is 99.000% to 99.999% by mass with respect to a total mass of the chemical liquid, a content of the isobutyl acetate is 1.0 to 1,000 mass ppm with respect to the total mass of the chemical liquid, and a content of the metal component is 0.01 to 100 mass ppt with respect to the total mass of the chemical liquid.
(24) A chemical liquid containing n-butyl acetate, isobutyl acetate, pentyl acetates, propionic acid butyl ester, 1-butanol, butyl formate, and dibutyl ether, in which a content of the n-butyl acetate is 99.000% to 99.999% by mass with respect to a total mass of the chemical liquid, a content of the isobutyl acetate is 1.0 to 1,000 mass ppm with respect to the total mass of the chemical liquid, a content of the pentyl acetates is 0.1 to 4,000 mass ppm with respect to the total mass of the chemical liquid, a content of the propionic acid butyl ester is 0.1 to 4,000 mass ppm with respect to the total mass of the chemical liquid, a content of the 1-butanol is 0.1 to 4,000 mass ppm with respect to the total mass of the chemical liquid, a content of the butyl formate is 0.1 to 4,000 mass ppm with respect to the total mass of the chemical liquid, and a content of the dibutyl ether is 0.1 to 4,000 mass ppm with respect to the total mass of the chemical liquid.
(25) A method for manufacturing a chemical liquid storage body including a container and the chemical liquid described in (1), the method including, in the following order, a step of distilling a n-butyl acetate-containing substance to be purified (preferably a solution containing n-butyl acetate, isobutyl acetate, and components other than n-butyl acetate and isobutyl acetate) so as to obtain a distilled substance to be purified, a first filtration step of filtering the distilled substance to be purified by using a filter having a pore size equal to or greater than 100 nm, a second filtration step of filtering a substance to be purified obtained through the first filtration step by using a fluororesin-containing filter having a pore size equal to or less than 10 nm so as to obtain a chemical liquid, and a storage step of storing the obtained chemical liquid in the container so that a void volume in the container determined by Equation (1) which will be described later is 2% to 35% by volume.
(26) A chemical liquid storage body including a container and the chemical liquid described in (1), in which a liquid contact portion coming into contact with the chemical liquid in the container is formed of electropolished stainless steel or a fluororesin, and a void volume in the container determined by Equation (1) which will be described later is 2% to 35% by volume.
(27) A resist pattern forming method including a step of forming a coating film on a substrate by using an actinic ray-sensitive or radiation-sensitive resin composition, a step of exposing the coating film, and a step of forming a resist pattern by developing the exposed coating film by using a developer, in which the actinic ray-sensitive or radiation-sensitive resin composition contains a resin including a repeating unit selected from the group consisting of a repeating unit represented by Formula (a) which will be described later, a repeating unit represented by Formula (b) which will be described later, a repeating unit represented by Formula (c) which will be described later, a repeating unit represented by Formula (d) which will be described later, and a repeating unit represented by Formula (e) which will be described later, and the developer is the chemical liquid described in (1).
(28) A resist pattern forming method including a step of forming a coating film on a substrate by using an actinic ray-sensitive or radiation-sensitive resin composition, a step of exposing the coating film, a step of forming a resist pattern by developing the exposed coating film by using a developer, and a step of washing the resist pattern by using a rinsing solution, in which the developer is the chemical liquid described in (1), and the rinsing solution is n-butyl acetate.

According to an aspect of the present invention, a chemical liquid can be provided which makes it possible to form a resist pattern while inhibiting pattern interval variation in a case where the chemical liquid is used as a developer or rinsing solution.

Furthermore, according to an aspect of the present invention, it is possible to provide a chemical liquid storage body, a resist pattern forming method, and a semiconductor chip manufacturing method.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, the range of numerical values described using "to" means a range including the numerical values listed before and after "to" as the lower limit and the upper limit.

Furthermore, in the present invention, "ppm" means "parts-per-million ($10^{-6}$)", and "ppt" means "parts-per-trillion ($10^{-12}$)".

In the present invention, regarding the description of a group (atomic group), in a case where whether the group is substituted or unsubstituted is not described, as long as the effects of the present invention are not impaired, the group includes a group which does not contain a substituent and a group which contains a substituent. For example, "hydrocarbon group" includes not only a hydrocarbon group which does not contain a substituent (unsubstituted hydrocarbon group) but also a hydrocarbon group which contains a substituent (substituted hydrocarbon group). The same is true of each compound.

In the present invention, "radiation" means, for example, far ultraviolet, extreme ultraviolet (EUV), X-rays, electron beams, and the like. In addition, in the present invention, light means actinic rays or radiation. In the present invention, unless otherwise specified, "exposure" includes not only exposure by far ultraviolet, X-rays, EUV, and the like, but also lithography by particle beams such as electron beams or ion beams.

The inventors of the present invention examined the characteristics of n-butyl acetate. As a result, the inventors have found that in a case where n-butyl acetate and a predetermined amount of isobutyl acetate are used in combination, a pattern interval variation is inhibited. Specific reasons why the effects of the present invention are obtained are unclear. It is considered that in a case where a predetermined amount of isobutyl acetate is used, the solubility of the coating film in the chemical liquid may be improved, the occurrence of undissolved residues of the coating film and the like may be inhibited, and consequently, the pattern interval variation may be inhibited. The reason is as assumed to be as below. Presumably, because n-butyl acetate and isobutyl acetate are similar to each other in structure, the isobutyl acetate may dissolve components poorly soluble in the n-butyl acetate without hindering the dissolution ability of the n-butyl acetate. Furthermore, as will be described later, it has been confirmed that even in a case where the chemical liquid contains a predetermined amount of pentyl acetates, propionic acid butyl ester, butyl formate, dibutyl ether, and the like, greater effects can be obtained. The reason is assumed to be as below. Presumably, because these components are similar to n-butyl acetate in structure just as isobutyl acetate, the components may have improved the characteristics of the chemical liquid without hindering the dissolution ability of the n-butyl acetate.

The chemical liquid according to an embodiment of the present invention (hereinafter, also simply called "chemical liquid") is a chemical liquid containing n-butyl acetate and isobutyl acetate.

Hereinafter, the components contained in the chemical liquid according to an embodiment of the present invention will be specifically described.

<N-Butyl Acetate>

The chemical liquid contains n-butyl acetate. The n-butyl acetate is a compound represented by the following structural formula.

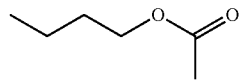

The content of the n-butyl acetate in the chemical liquid is 99.000% to 99.999% by mass with respect to the total mass of the chemical liquid. Particularly, in view of further inhibiting pattern interval variation (hereinafter, also simply described as "in view of further improving the effects of the present invention"), the content of the n-butyl acetate is preferably 99.500% to 99.995% by mass, more preferably 99.700% to 99.990% by mass, and even more preferably 99.900% to 99.990% by mass.

<Isobutyl Acetate>

The chemical liquid contains isobutyl acetate. The isobutyl acetate is a compound represented by the following structural formula.

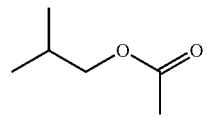

The content of the isobutyl acetate in the chemical liquid is 1.0 to 1000 mass ppm with respect to the total mass of the chemical liquid. Particularly, in view of further improving the effects of the present invention, the content of the isobutyl acetate is preferably 10 to 950 mass ppm, more preferably 100 to 950 mass ppm, and even more preferably 300 to 950 mass ppm.

The chemical liquid may contain components other than the n-butyl acetate and the isobutyl acetate.

Hereinafter, those other components will be specifically described.

<Pentyl Acetates>

The chemical liquid may contain pentyl acetates. Pentyl acetates mean a compound represented by the following structural formula in which R is an alkyl group having 5 carbon atoms. The alkyl group may be linear or branched.

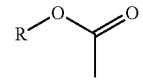

More specifically, examples of the pentyl acetates include 1-methylbutyl acetate, 2-methylbutyl acetate, 3-methylbutyl acetate, 1,1-dimethylpropyl acetate, 2,2-dimethylpropyl acetate, and n-pentyl acetate.

In view of further improving the effects of the present invention, it is preferable that the pentyl acetates contain at least one kind of compound selected from the group consisting of 1-methylbutyl acetate, 2-methylbutyl acetate, and 3-methylbutyl acetate among the above.

The content of the pentyl acetates in the chemical liquid is not particularly limited, and may be, for example, 0.1 to 4,000 mass ppm. In many cases, the content of the pentyl acetates in the chemical liquid is 0.1 to 2,000 mass ppm. In view of further improving the effects of the present invention, the content of the pentyl acetates with respect to the total mass of the chemical liquid is preferably 1.0 to 300 mass ppm, and more preferably 1.0 to 250 mass ppm.

In a case where a plurality of compounds is incorporated into the chemical liquid as the pentyl acetates, it is preferable that the total amount thereof be within the above range.

The mass ratio of the content of the isobutyl acetate to the content of the pentyl acetates is not particularly limited, and may be, for example, 0.10 to 500.0. In view of further improving the effects of the present invention, the mass ratio is preferably 0.5 to 300.

<Propionic Acid Butyl Ester>

The chemical liquid may contain propionic acid butyl ester. The propionic acid butyl ester is a compound represented by the following structural formula.

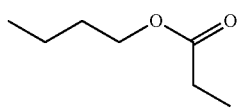

The content of the propionic acid butyl ester in the chemical liquid is not particularly limited, and may be, for example, 0.1 to 4,000 mass ppm. In many cases, the content of the propionic acid butyl ester in the chemical liquid is 0.1 to 2,000 mass ppm. In view of further improving the effects of the present invention, the content of the propionic acid butyl ester with respect to the total mass of the chemical liquid is preferably 1.0 to 700 mass ppm, and more preferably 1.0 to 650 mass ppm.

The mass ratio of the content of the propionic acid butyl ester to the content of the pentyl acetates is not particularly limited, and may be, for example, 0.01 to 20.00. In view of further improving the effects of the present invention, the mass ratio is preferably 0.10 to 10.0.

<Butyl Formate>

The chemical liquid may contain butyl formate. The butyl formate is a compound represented by the following structural formula.

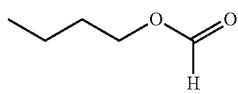

The content of the butyl formate in the chemical liquid is not particularly limited, and may be, for example, 0.1 to 4,000 mass ppm. In many cases, the content of the butyl formate in the chemical liquid is 0.1 to 100 mass ppm. In view of further improving the effects of the present invention, the content of the butyl formate with respect to the total mass of the chemical liquid is preferably 1.0 to 50 mass ppm, and more preferably 1.0 to 48 mass ppm.

<Dibutyl Ether>

The chemical liquid may contain dibutyl ether. The dibutyl ether is a compound represented by the following structural formula.

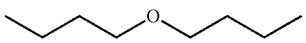

The content of the dibutyl ether in the chemical liquid is not particularly limited, and may be, for example, 0.1 to 4,000 mass ppm. In many cases, the content of the dibutyl ether in the chemical liquid is 0.1 to 3,500 mass ppm. In view of further improving the effects of the present invention, the content of the dibutyl ether with respect to the total mass of the chemical liquid is preferably 5.0 to 500 mass ppm.

The mass ratio of the content of the dibutyl ether to the content of the pentyl acetates is not particularly limited, and may be, for example, 0.10 to 50.0. In view of further improving the effects of the present invention, the mass ratio is preferably higher than 0.5 and equal to or lower than 35.0.

<1-Butanol>

The chemical liquid may contain 1-butanol.

The content of the 1-butanol in the chemical liquid is not particularly limited, and may be, for example, 0.1 to 4,000 mass ppm. In view of further improving the effects of the present invention, the content of the 1-butanol with respect to the total mass of the chemical liquid is preferably 5.0 to 3,500 mass ppm, and more preferably 5 to 3,000 mass ppm.

<Sulfate Ion>

The chemical liquid may contain a sulfate ion ($SO_4^{2-}$).

The content of the sulfate ion in the chemical liquid is not particularly limited, and may be, for example, 0.1 to 500 mass ppm. In view of further improving the effects of the present invention, the content of the sulfate ion with respect to the total mass of the chemical liquid is preferably 1.0 to 200 mass ppm, and more preferably 1.5 to 150 mass ppm.

The mass ratio of the content of the sulfate ion to the content of the pentyl acetates is not particularly limited, and may be, for example, 0.01 to 15.0. In view of further improving the effects of the present invention, the mass ratio is preferably 0.01 to 10.0.

<Metal Component>

The chemical liquid may contain a metal component.

In the present invention, examples of the metal component include metal particles and metal ions. For example, the content of the metal component means the total content of metal particles and metal ions.

The chemical liquid may contain either metal particles or metal ions, or may contain both of them.

Examples metal elements in the metal component include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), and Zr (zirconium). The metal component may contain one kind of metal element or two or more kinds of metal elements.

The metal particles may be simple metal particles or metal alloy particles.

The metal component may be a metal component which is inevitably incorporated into each component (raw material) of the chemical liquid or a metal component inevitably incorporated into the chemical liquid during the manufacturing, storage, and/or transfer of the chemical liquid. Alternatively, the metal component may be intentionally added.

In a case where the chemical liquid contains a metal component, the content of the metal component is not particularly limited and may be, for example, 0.01 to 500 mass ppt with respect to the total mass of the chemical liquid. Particularly, in view of further improving the effects of the present invention, the content of the metal component is preferably 0.01 to 150 mass ppt.

In a case where the chemical liquid contains metal ions, in view of further improving the effects of the present invention, the content of the metal ions with respect to the total mass of the chemical liquid is preferably 0.01 to 200 mass ppt, more preferably 0.01 to 100 mass ppt, and even more preferably 0.01 to 60 mass ppt.

In a case where the chemical liquid contains metal particles, in view of further improving the effects of the present invention, the content of the metal particles with respect to the total mass of the chemical liquid is preferably 0.01 to 200 mass ppt, more preferably 0.01 to 100 mass ppt, and even more preferably 0.01 to 40 mass ppt.

The mass ratio of the content of the isobutyl acetate to the content of the metal component is not particularly limited, and may be, for example, $10^3$ to $10^8$. In view of further improving the effects of the present invention, the mass ratio is preferably $10^4$ to $10^7$.

The mass ratio of the content of the sulfate ion to the content of the metal component is not particularly limited, and may be, for example, $10^3$ to $10^9$. In view of further improving the effects of the present invention, the mass ratio is preferably $10^4$ to $10^8$.

The type and content of metal ions and metal particles in the chemical liquid can be measured by single particle inductively coupled plasma mass spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of metal component as a measurement target is measured regardless of the way the metal component is present. Accordingly, the total mass of metal particles and metal ions as a measurement target is quantified as the content of the metal component.

With SP-ICP-MS, the content of metal particles can be measured. Accordingly, by subtracting the content of the metal particles from the content of the metal component in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of the metal-containing particles can be measured by the method described in Examples. In addition to the device described above, it is possible to use NexION350S manufactured by PerkinElmer Inc. and Agilent 8900 manufactured by Agilent Technologies, Inc.

The chemical liquid may contain water in addition to the above.

<Chemical Liquid Manufacturing Method>

The method for manufacturing the aforementioned chemical liquid is not particularly limited, and examples thereof include known manufacturing methods.

For example, the chemical liquid may be manufactured by adding a predetermined amount of isobutyl acetate to n-butyl acetate or manufactured by purchasing a commercial product and performing a purification treatment on the product. One of the examples of the chemical liquid manufacturing methods is a method including at least a step of distilling a substance to be purified (distillation step) or a step of filtering a substance to be purified (filtration step). Examples of the substance to be purified include a commercial n-butyl acetate solution. The commercial product contains impurities in many cases. For example, sometimes the commercial product contains an excess of isobutyl acetate and other impurities.

Hereinafter, the procedures of the distillation step and the filtration step will be specifically described.

(Distillation Step)

The distillation step is a step of distilling a substance to be purified (a solution containing n-butyl acetate and isobutyl acetate, such as a solution containing n-butyl acetate, isobutyl acetate, and components other than n-butyl acetate and isobutyl acetate) so as to obtain a distilled substance to be purified. The components to be removed by the distillation step are not particularly limited, and examples thereof include isobutyl acetate, pentyl acetates, propionic acid butyl ester, 1-butanol, butyl formate, a sulfate ion, and water.

The method of distilling the substance to be purified is not particularly limited, and known methods can be used. Typically, examples thereof include a method of disposing a distillation column on a primary side of the purification device used in the filtration step, which will be described later, and introducing the distilled substance to be purified into a manufacturing tank.

At this time, the liquid contact portion of the distillation column is not particularly limited, but is preferably formed of the anticorrosive material which will be described later.

In the distillation step, the substance to be purified may be passed through the same distillation column multiple times, or the substance to be purified may be passed through different distillation columns. In a case where the substance to be purified is passed through different distillation columns, for example, a method may be used in which a rough distillation treatment is performed to remove low-boiling-point components and the like by passing the substance to be purified through a distillation column and then a fractionation treatment is performed to remove other components by passing the substance to be purified through a distillation column different from the distillation column used in the rough distillation treatment.

Examples of the distillation column include a plate distillation column and a pressure-reducing plate distillation column.

Furthermore, in order to satisfy both the thermal stability and purification accuracy during distillation, distillation under reduced pressure may also be performed.

(Filtration Step)

The filtration step is a step of filtering the aforementioned substance to be purified by using a filter.

The method of filtering the substance to be purified by using a filter is not particularly limited. However, it is preferable to use a method of passing the substance to be purified through a filter unit (letting the substance to be purified run through a filter unit) including a housing and a filter cartridge stored in the housing under pressure or under no pressure.

The pore size of the filter is not particularly limited, and a filter having a pore size that is generally used for filtering the substance to be purified can be used. Especially, the pore size of the filter is preferably equal to or less than 200 nm, more preferably equal to or less than 20 nm, and even more preferably equal to or less than 10 nm. The lower limit thereof is not particularly limited. In view of productivity, the lower limit is preferably equal to or greater than 1 nm in general.

In the present specification, the pore size of a filter means a pore size determined by the bubble point of isopropanol.

The way the two or more kinds of filters having different pore sizes are used in order is not particularly limited. For example, a method may be used in which a plurality of filter units including filters is arranged along a pipe line through which the substance to be purified is transferred. At this time, in a case where an attempt is made to set the flow rate of the substance to be purified per unit time to be constant throughout the entire pipe line, sometimes the pressure applied to a filter having a smaller pore size is higher than the pressure applied to a filter having a larger pore size. In this case, it is preferable to dispose a pressure control valve, a damper, or the like between the filters such that constant pressure is applied to the filter having a smaller pore size, or to arrange filter units housing the same filters in a row along the pipe line such that the filtration area is enlarged.

The material of the filter is not particularly limited, and examples thereof include materials known as filter materials. Specifically, examples of the material of the filter include a resin like polyamide such as nylon (for example, 6-nylon and 6,6-nylon); polyolefin such as polyethylene and polypropylene; polystyrene; polyimide; polyamide imide; poly (meth)acrylate; a fluororesin such as polytetrafluoroethylene, perfluoroalkoxyalkane, a perfluoroethylene propene copolymer, an ethylene-tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like.

Among these, at least one kind of resin selected from the group consisting of nylon (particularly preferably 6,6-nylon), polyolefin (particularly preferably polyethylene), poly(meth)acrylate, and a fluororesin (particularly preferably polytetrafluoroethylene (PTFE) or perfluoroalkoxyalkane (PFA)) is preferable, because this resin has higher solvent resistance and makes it possible to obtain a chemical liquid having further improved defect inhibition performance. One kind of each of these polymers can be used singly, or two or more kinds of these polymers can be used in combination.

In addition to the resin, diatomite, glass, and the like may be used.

Furthermore, a polymer (such as nylon-grafted UPE) obtained by bonding polyamide (for example, nylon such as nylon-6 or nylon-6,6) to polyolefin (such as UPE (ultra-high-molecular-weight polyethylene) which will be described later) by graft copolymerization may be used as the material of the filter.

Furthermore, the filter may be a filter having undergone a surface treatment. The surface treatment method is not particularly limited, and known methods can be used. Examples of the surface treatment method include a chemical modification treatment, a plasma treatment, a hydrophobization treatment, coating, a gas treatment, sintering, and the like.

As the chemical modification treatment, a method of introducing ion exchange groups into the filter is preferable.

That is, as the filter, a filter having ion exchange groups may be used.

Examples of the ion exchange groups include cation exchange groups and anion exchange groups. Examples of the cation exchange groups include a sulfonic acid group, a carboxyl group, and a phosphoric acid group. Examples of the anion exchange groups include a quaternary ammonium group. The method of introducing ion exchange groups into the filter is not particularly limited, and examples thereof include a method of reacting a compound containing ion exchange groups and polymerizable groups with the filter (typically, a method of grafting the compound on the filter).

The method of introducing the ion exchange groups is not particularly limited. For example, the filter is irradiated with ionizing radiation (such as α-rays, β-rays, γ-rays, X-rays, or electron beams) so that active portions (radicals) are generated. After being irradiated, the filter is immersed in a monomer-containing solution so that the monomer is graft-polymerized with the filter. As a result, the polymer obtained by the polymerization of the monomer is grafted on the filter. By bringing the generated polymer into contact with a compound containing anion exchange groups or cation exchange groups so that a reaction occurs, ion exchange groups can be introduced into the polymer.

In a case where the filter containing ion exchange groups is used, the content of metal particles and metal ions in the chemical liquid is more easily controlled within a desired range. The material constituting the filter having ion exchange groups is not particularly limited, and examples thereof include materials obtained by introducing ion exchange groups into a fluororesin and a polyolefin. Among these, the material obtained by introducing ion exchange groups into a fluororesin is more preferable.

The pore size of the filter containing ion exchange groups is not particularly limited, but is preferably 1 to 30 nm and more preferably 5 to 20 nm.

As the filter used in the filtration step, two or more kinds of filters made of different materials may be used. For example, two or more kinds of filters may be used which are made of materials selected from the group consisting of a polyolefin, a fluororesin, polyamide, and a material obtained by introducing ion exchange groups into these materials.

The pore structure of the filter is not particularly limited, and may be appropriately selected depending on the components in the substance to be purified. In the present specification, the pore structure of the filter means a pore size distribution, a positional distribution of pores in the filter, a pore shape, and the like. Typically, the pore structure can be controlled by the filter manufacturing method.

For example, in a case where powder of a resin or the like is sintered to form a filter, a porous membrane is obtained. Furthermore, in a case where a method such as electrospinning, electroblowing, or melt blowing is used to form a filter, a fiber membrane is obtained. These have different pore structures.

"Porous membrane" means a membrane which retains components in a substance to be purified, such as gel, particles, colloids, cells, and oligomers, but allows the components substantially smaller than the pores of the membrane to pass through the pores. The retention of components in the substance to be purified by the porous membrane depends on operating conditions (for example, the surface velocity, the use of a surfactant, the pH, and a combination of these) in some cases. Furthermore, the retention of components can depend on the pore size and structure of the porous membrane, and the size and structure of particles supposed to be removed (such as whether the particles are hard particles or gel).

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pore size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the holes changes in the membrane. Typically, the pore size increases toward the other surface of the membrane from one surface of the membrane. In this case, the surface with many pores having a large pore size is called "open side", and the surface with many pores having a small pore size is also called "tight side".

Examples of the asymmetric porous membrane include a membrane in which the pore size is minimized at a position in the thickness direction of the membrane (this is also called "hourglass shape").

It is preferable that the filters be used after being thoroughly washed before use.

In a case where an unwashed filter (or a filter that has not been thoroughly washed) is used, the impurities contained in the filter are easily mixed into the chemical liquid.

As described above, the filtration step according to an embodiment of the present invention may e a multi-stage filtration step in which the substance to be purified is passed through two or more kinds of different filters. The different filters mean filters different from each other in terms of at least one of the pore size, pore structure, or material.

Furthermore, the substance to be purified may be passed through the same filter multiple times or passed through a plurality of filters of the same type.

In addition, in view of ease of manufacturing the chemical liquid according to an embodiment of the present invention, it is preferable to use a fluororesin-containing filter. The fluororesin-containing filter is particularly preferably for multi-stage filtration using a plurality of filters. As the fluororesin-containing filter, a filter having a pore size equal to or less than 20 nm is preferable.

Especially, in view of ease of manufacturing the chemical liquid according to an embodiment of the present invention, it is preferable to perform a first filtration step of filtering a substance to be purified by using a filter having a pore size equal to or greater than 100 nm and a second filtration step of filtering the substance to be purified by using a fluororesin-containing filter (preferably a filter made of PTFE) having a pore size equal to or less than 10 nm in this order. In the first filtration step, coarse particles are removed.

The material of a liquid contact portion of the purification device used in the filtration step is not particularly limited (the liquid contact portion means an inner wall surface or the like that is likely to come into contact with the substance to be purified and the chemical liquid). However, it is preferable that the liquid contact portion be formed of at least one kind of material selected from the group consisting of a nonmetallic material (such as a fluororesin) and an electropolished metallic material (such as stainless steel) (hereinafter, these materials will be collectively called "anticorrosive material").

The aforementioned nonmetallic material is not particularly limited, and examples thereof include known materials.

Examples of the nonmetallic material include at least one kind of material selected from the group consisting of a polyethylene resin, a polypropylene resin, a polyethylene-polypropylene resin, and a fluororesin (for example, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoroethylene-ethylene copolymer resin, a vinylidene fluoride resin, a chlorotrifluoroethylene copolymer resin, a vinyl fluoride resin, and the like).

The aforementioned metallic material is not particularly limited, and examples thereof include known materials.

Examples of the metallic material include a metallic material in which the total content of chromium and nickel is greater than 25% by mass with respect to the total mass of the metallic material. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel and a nickel-chromium alloy.

The stainless steel is not particularly limited, and examples thereof include known stainless steel. Among these, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The nickel-chromium alloy is not particularly limited, and examples thereof include known nickel-chromium alloys. Among these, a nickel-chromium alloy is preferable in which the nickel content is 40% to 75% by mass and the chromium content is 1% to 30% by mass.

Examples of the nickel-chromium alloy include HASTELLOY (trade name, the same is true of the following description), MONEL (trade name, the same is true of the following description), and INCONEL (trade name, the same is true of the following description). More specifically, examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Furthermore, if necessary, the nickel-chromium alloy may further contain boron, silicon, tungsten, molybdenum, copper, cobalt, and the like in addition to the aforementioned alloy.

The method of electropolishing the metallic material is not particularly limited, and known methods can be used. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may be higher than the chromium content in the parent phase. Therefore, presumably, in a case where a purification device having a liquid contact portion formed of the electropolished metallic material is used, metal particles may be hardly eluted into the substance to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

During the purification of the substance to be purified, it is preferable that all of the opening of a container, washing of a container and a device, storage of a solution, analysis, and the like that included in the purification be performed in a clean room. It is preferable that the clean room have a cleanliness equal to or higher than class 4 specified in the international standard ISO14644-1:2015 established by International Organization for Standardization. Specifically, the clean room preferably meets any of ISO class 1, ISO class 2, ISO class 3, or ISO class 4, more preferably meets ISO class 1 or ISO class 2, and even more preferably meets ISO class 1.

One of the examples of suitable aspects of the method for manufacturing the chemical liquid according to an embodiment of the present invention is a manufacturing method including, in the following order, a step of distilling a n-butyl acetate-containing substance to be purified (preferably a solution containing n-butyl acetate, isobutyl acetate, and components other than n-butyl acetate and isobutyl acetate) so as to obtain a distilled substance to be purified, a first filtration step of filtering the distilled substance to be purified by using a filter having a pore size equal to or greater than 100 nm, and a second filtration step of filtering a substance to be purified obtained through the first filtration step by using a fluororesin-containing filter (preferably a filter made of PTFE) having a pore size equal to or less than 10 nm.

<Chemical Liquid Storage Body>

The chemical liquid may be stored in a container and kept as it is until use. The container and the chemical liquid stored in the container are collectively referred to as chemical liquid storage body. The preserved chemical liquid is used after being taken out of the chemical liquid storage body.

As the container storing the chemical liquid, a container for manufacturing semiconductor devices is preferable which has a high internal cleanliness and hardly causes elution of impurities.

The container that can be used is not particularly limited, and examples thereof include a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

The liquid contact portion of the container may be the aforementioned anticorrosive material (preferably electropolished stainless steel or a fluororesin) or glass. In view of further improving the effects of the present invention, it is preferable that 90% or more of the area of the liquid contact portion be formed of the above material. It is more preferable that the entirety of the liquid contact portion be formed of the above material.

The void volume in the container of the chemical liquid storage body is preferably 2% to 35% by volume, and more preferably 5% to 30% by volume. That is, in the method for manufacturing the chemical liquid storage body according to an embodiment of the present invention, it is preferable to perform a storage step of storing the obtained chemical liquid in the container so that the void volume in the container is 2% to 35% by volume. The void volume is calculated according to Equation (1).

$$\text{void volume} = \{1-(\text{volume of chemical liquid in container/container volume})\} \times 100 \quad \text{Equation (1):}$$

The container volume has the same definition as the internal volume (capacity) of the container.

In a case where the void volume is set within the above range, the contaminants such as impurities are inhibited, and storage stability can be ensured.

<Use of Chemical Liquid>

The chemical liquid according to an embodiment of the present invention is preferably used for manufacturing semiconductor devices (preferably a semiconductor chip).

The chemical liquid can also be used for other uses in addition to the manufacturing of semiconductor devices. The chemical liquid can be used as a developer or a rinsing solution of polyimide, a resist for a sensor, and a resist for a lens.

The chemical liquid can also be used as a solvent for medical uses or for washing. For example, the chemical liquid can be suitably used for washing containers, piping, substrates (for example, a wafer and glass), and the like.

The chemical liquid for washing is preferably used as a washing solution (such as a piping washing solution or a container washing solution) for washing piping, a container, and the like that come into contact with a liquid such as the prewet solution described above.

The chemical liquid according to an embodiment of the present invention is most preferably used as a developer or a rinsing solution in forming a resist pattern.

In a first suitable aspect, for example, the chemical liquid is used as a developer in a resist pattern forming method having the following Steps 1 to 3.

Step 1: a step of forming a coating film on a substrate by using an actinic ray-sensitive or radiation-sensitive resin composition Step 2: a step of exposing the coating film Step 3: a step of forming a resist pattern by developing the exposed coating film by using a developer In a second suitable aspect, for example, the chemical liquid is used as a rinsing solution in a resist pattern forming method having the following Steps 1 to 4.

Step 1: a step of forming a coating film on a substrate by using an actinic ray-sensitive or radiation-sensitive resin composition Step 2: a step of exposing the coating film Step 3: a step of forming a resist pattern by developing the exposed coating film by using a developer Step 4: a step of washing the resist pattern by using a rinsing solution Hereinafter, Steps 1 to 4 will be specifically described.

(Step 1)

Step 1 is a step of forming a coating film on a substrate by using an actinic ray-sensitive or radiation-sensitive resin composition (hereinafter, also called "resist composition").

Examples of the method of forming a coating film on a substrate by using the resist composition include a method of coating a predetermined substrate with the resist composition. As the coating method, spin coating is preferable.

The thickness of the coating film is not particularly limited. In view of making it possible to form a fine pattern with higher accuracy, the thickness of the coating film is preferably 10 to 200 nm.

The type of the substrate is not particularly limited, and examples thereof include a silicon substrate and a silicon substrate coated with silicon dioxide.

It is preferable that the resist composition contain a resin having a group which is decomposed by the action of an acid and generates a polar group (acid-decomposable resin) (hereinafter, this resin will be also called "resin P"). As the resin P, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also called "acid-decomposable group").

Examples of the polar group include an alkali-soluble group. Examples of the alkali-soluble group include a carboxyl group, a fluorinated alcohol group (preferably a hexafluoroisopropanol group), a phenolic hydroxyl group, and a sulfo group.

In the acid-decomposable group, the polar group is protected with a group dissociated by an acid (acid-dissociable group). Examples of the acid-dissociable group include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

It is preferable that the resin P contain a repeating unit represented by Formula (AI).

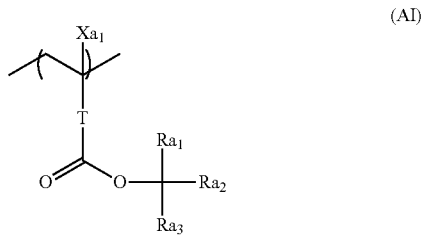

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ is preferably an alkyl group having 1 to 4 carbon atoms.

The cycloalkyl group represented by $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by the bonding of two groups out of $Ra_1$ to $Ra_3$ is preferably a monocyclic cycloalkyl group such as a cyclopentyl group and a cyclohexyl group or a polycyclic cycloalkyl group such as a norbornyl group, a tetracyclodecanyl group, a tetracyclododecanyl group, and an adamantyl group, and more preferably a monocyclic cycloalkyl group having 5 or 6 carbon atoms.

In the cycloalkyl group formed by the bonding of two groups out of $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ are bonded to each other to form the aforementioned cycloalkyl group.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms), and the like. As the substituent, a substituent having 8 or less carbon atoms is preferable.

The content of the repeating unit represented by Formula (AI) with respect to all the repeating units in the resin P is preferably 20 to 90 mol %, more preferably 25 to 85 mol %, and even more preferably 30 to 80 mol %.

It is preferable that the resin P contain a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure have a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

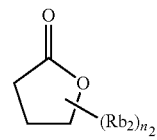

LC1-1

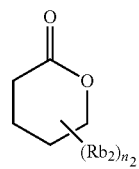

LC1-2

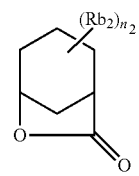

LC1-3

-continued

LC1-4 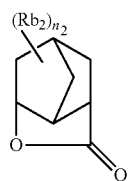

LC1-5 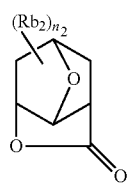

LC1-6 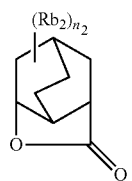

LC1-7 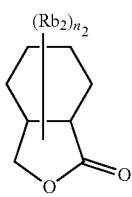

LC1-8 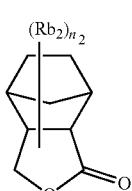

LC1-9 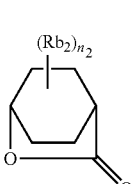

LC1-10 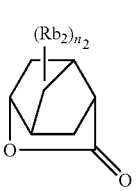

LC1-11 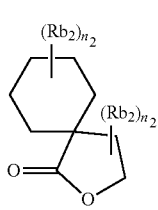

-continued

LC1-12 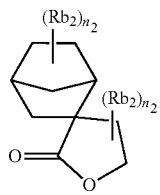

LC1-13 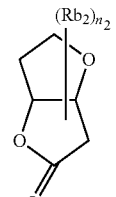

LC1-14 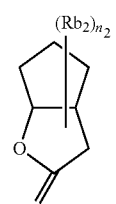

LC1-15 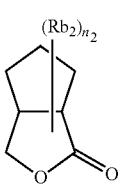

LC1-16 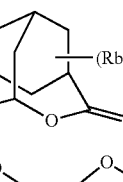

LC1-17 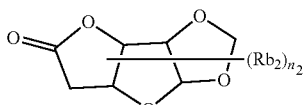

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and a plurality of substituents ($Rb_2$) may be bonded to each other to form a ring.

The resin P may further contain a repeating unit containing an organic group having a polar group, particularly, a repeating unit having an alicyclic hydrocarbon structure substituted with a polar group.

As the alicyclic hydrocarbon structure substituted with a polar group, an adamantyl group, a diamantyl group, or a norbornane group is preferable. As the polar group, a hydroxyl group or a cyano group is preferable.

In a case where the resin P contains the repeating unit containing an organic group having a polar group, the content of the repeating unit with respect to all the repeating units in the resin P is preferably 1 to 50 mol %, more preferably 1 to 30 mol %, and even more preferably 5 to 25 mol %.

The resin P is preferably a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

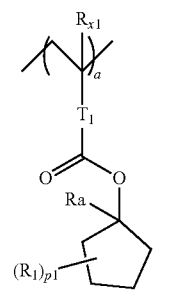
(a)

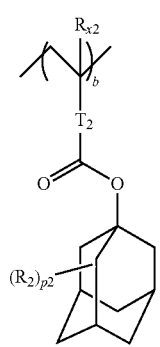
(b)

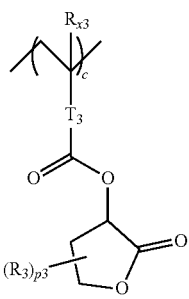
(c)

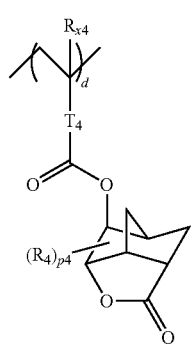
(d)

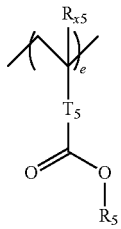
(e)

$R_{x1}$ to $R_{x5}$ each independently represent a hydrogen atom or an alkyl group which may have a substituent.

$R_1$ to $R_4$ each independently represent a monovalent substituent, and $p_1$ to $p_4$ each independently represent 0 or a positive integer.

Ra represents a linear or branched alkyl group.

$T_1$ to $T_5$ each independently represent a single bond or a divalent linking group.

$R_5$ represents a monovalent organic group.

a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, a+b+c+d+e=100, and a+b≠0.

The repeating unit (e) has a structure different from all of the repeating units (a) to (d).

Examples of the alkyl group represented by $R_{x1}$ to $R_{x5}$ that may have a substituent include a methyl group and a group represented by —$CH_2$—$R_{11}$. $R_{11}$ represents a halogen atom (such as a fluorine atom), a hydroxyl group, or a monovalent organic group.

$R_{x1}$ to $R_{x5}$ preferably each independently represent a hydrogen atom, a methyl group, a trifluoromethyl group, or a hydroxymethyl group.

Examples of the divalent linking group represented by $T_1$ to $T_5$ include an alkylene group, a —COO-Rt- group, a —O-Rt- group, and the like. In the formulae, Rt represents an alkylene group or a cycloalkylene group.

$T_1$ to $T_5$ preferably each independently represent a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

Ra represents a linear or branched alkyl group. Examples thereof include a methyl group, an ethyl group, a t-butyl group, and the like. Among these, a linear or branched alkyl group having 1 to 4 carbon atoms is preferable.

$R_1$ to $R_4$ each independently represent a monovalent substituent. $R_1$ to $R_4$ are not particularly limited, and examples thereof include a hydroxyl group, a cyano group, and a linear or branched alkyl or cycloalkyl group having a hydroxyl group, a cyano group, and the like.

p1 to p4 each independently represent 0 or a positive integer. The upper limit of p1 to p4 equals the number of hydrogen atoms which can be substituted in each repeating unit.

$R_5$ represents a monovalent organic group. $R_5$ is not particularly limited, and examples thereof include a monovalent organic group having a sultone structure, a monovalent organic group having a cyclic ether such as tetrahydrofuran, dioxane, 1,4-thioxane, dioxolane, and 2,4,6-trioxabicyclo[3.3.0]octane, and an acid-decomposable group (for example, an adamantyl group quaternized by the substitution of carbon at a position bonded to a —COO group with an alkyl group).

The repeating unit (b) is preferably formed of the monomer described in paragraphs "0014" to "0018" in JP2016-138219A.

a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, $a+b+c+d+e=100$, and $a+b \neq 0$.

a+b (the content of the repeating unit having an acid-decomposable group with respect to all the repeating units) is preferably 20 to 90 mol %, more preferably 25 to 85 mol %, and even more preferably 30 to 80 mol %.

Furthermore, c+d (the content of the repeating unit having a lactone structure with respect to all the repeating units) is preferably 3 to 80 mol %, and more preferably 3 to 60 mol %.

The weight-average molecular weight of the resin P that is measured by gel permeation chromatography (GPC) and expressed in terms of polystyrene is preferably 1,000 to 200,000, and more preferably 3,000 to 20,000.

The content of the resin P in the total solid content of the resist composition is preferably 50% to 99.9% by mass, and more preferably 60% to 99.0% by mass.

The resist composition may contain components other than the resin P described above (for example, an acid generator, a basic compound, a quencher, a hydrophobic resin, a surfactant, a solvent, and the like).

As those other components, known components can be used. Examples of those other components to be incorporated into the resist composition include components incorporated into the actinic ray-sensitive or radiation-sensitive resin compositions described in JP2013-195844A, JP2016-057645A, JP2015-207006A, WO2014/148241A, JP2016-188385A, and JP2017-219818A, and the like.

(Step 2)

Step 2 is a step of exposing the coating film.

The type of the actinic rays and radiation used for exposure is not particularly limited. As the actinic rays and radiation, light having a wavelength equal to or shorter than 250 nm is preferable. Examples thereof include KrF excimer laser beams (248 nm), ArF excimer laser beams (193 nm), $F_2$ excimer laser beams (157 nm), EUV light (13.5 nm), electron beams, and the like.

During the exposure, if necessary, the coating film may be exposed through a mask.

(Step 3)

Step 3 is a step of forming a resist pattern by developing the exposed coating film by using a developer.

Examples of the development method include a method of immersing the substrate in a tank filled with a developer for a certain period of time (dipping method), a method of heaping up a developer on a surface of the substrate by surface tension and left the developer to stand for development (puddle method), a method of spraying a developer on a surface of the substrate (spray method), a method of continuously jetting a developer onto a substrate rotating at a constant speed from a jet nozzle while scanning the substrate with the nozzle (dynamic dispensing method), and the like.

The development time is preferably 10 to 300 seconds, and more preferably 20 to 120 seconds.

The temperature of the developer is preferably 0° C. to 50° C., and more preferably 15° C. to 35° C.

In a case where the aforementioned chemical liquid is used as a developer, if necessary, a surfactant may be incorporated into the developer.

(Step 4)

Step 4 is a step of washing the resist pattern by using a rinsing solution.

Examples of the rinsing method include a method of immersing the substrate in a tank filled with a rinsing solution for a certain period of time (dipping method), a method of heaping up a rinsing solution on a surface of the substrate by surface tension and left the rinsing solution to stand for development (puddle method), a method of spraying a rinsing solution on a surface of the substrate (spray method), a method of continuously jetting a rinsing solution onto a substrate rotating at a constant speed from a jet nozzle while scanning the substrate with the nozzle (dynamic dispensing method), and the like.

The rinsing time is preferably 10 to 300 seconds, and more preferably 20 to 120 seconds.

The temperature of the rinsing solution is preferably 0° C. to 50° C., and more preferably 15° C. to 35° C.

The first suitable aspect has the steps 1 to 3 as described above. The first suitable aspect may further have Step 4. In this case, as the rinsing solution used in Step 4, the chemical liquid according to an embodiment of the present invention may be used, or another known solvent (for example, butyl acetate) may be used.

The second suitable aspect has the steps 1 to 4 as described above. In this aspect, the chemical liquid according to an embodiment of the present invention is used as a rinsing solution. In Step 3 of the second suitable aspect, as a developer, the chemical liquid according to an embodiment of the present invention may be used, or another known solvent (for example, butyl acetate) may be used.

It is preferable that the resist pattern forming method be used for manufacturing semiconductor chips.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Accordingly, the scope of the present invention is not limited to the following examples.

For preparing chemical liquids of examples and comparative examples, the handling of containers, and the preparation, filling, storage, and analytical measurement of chemical liquids were all performed in a clean room of a level satisfying ISO class 2 or 1.

(Filter)

As filters, the following filters were used.

"PTFE 500 nm": Polytetrafluoroethylene filter, manufactured by Entegris, pore size of 500 nm "PTFE 200 nm": Polytetrafluoroethylene filter, manufactured by Entegris, pore size of 200 nm "PTFE 100 nm": Polytetrafluoroethylene filter, manufactured by Entegris, pore size of 100 nm "PTFE 50 nm": Polytetrafluoroethylene filter, manufactured by Entegris, pore size of 50 nm "PTFE 20 nm": Polytetrafluoroethylene filter, manufactured by Entegris, pore size of 20 nm "PTFE 10 nm": Polytetrafluoroethylene filter, manufactured by Entegris, pore size of 10 nm "PTFE 5 nm": Polytetrafluoroethylene filter, manufactured by Entegris, pore size of 5 nm "IEX": Ion exchange resin filter, manufactured by Entegris, pore size of 50 nm "PP 200 nm": Polypropylene filter, manufactured by Pall Corporation, pore size of 200 nm "UPE 3 nm": Ultra-high-molecular-weight polyethylene filter, manufactured by Pall Corporation, pore size of 3 nm "Nylon 5 nm": Nylon filter, manufactured by Pall Corporation, pore size of 5 nm <Substance to be Purified>

For manufacturing chemical liquids of examples and comparative examples, the following commercial n-butyl acetate was used as a substance to be purified.

What is shown in the column of "Raw material" in Table 1 is the manufacturer of the substance to be purified used in examples and comparative examples.

<Container>

The following containers were used as containers for storing the chemical liquid.

EP-SUS: A container having a liquid contact portion made of electropolished stainless steel.

PFA: A container having a liquid contact portion coated with perfluoroalkoxyalkane.

Table 1 shows the void volume in each container.

<Purification Procedure>

One of the above substances to be purified was selected and subjected to the distillation and purification treatment described in Table 1.

In the column of "Distillation and purification" in the table, "Performed-1" means that atmospheric distillation using a distillation column (theoretical number of plates: 30) was performed twice, "Performed-2" means that atmospheric distillation using a distillation column (theoretical number of plates: 30) was performed once, "Performed-3" means that atmospheric distillation using a distillation column (theoretical number of plates: 25) was performed twice, "Performed-4" means that atmospheric distillation using a distillation column (theoretical number of plates: 20) was performed twice, "Performed-5" means that atmospheric distillation using a distillation column (theoretical number of plates: 20) was performed once, "Performed-6" means that atmospheric distillation using a distillation column (theoretical number of plates: 10) was performed twice, "Performed-7" means that atmospheric distillation using a distillation column (theoretical number of plates: 10) was performed once, "Performed-8" means that atmospheric distillation using a distillation column (theoretical number of plates: 8) was performed twice, and "Performed-9" means that atmospheric distillation using a distillation column (theoretical number of plates: 8) was performed once.

Then, the distilled and purified substance to be purified was stored in a storage tank. The substance to be purified stored in the storage tank was filtered by being passed through the filters 1 to 3 described in Table 1 in this order, and stored in a storage tank.

Thereafter, as shown in Table 1 which will be described later, in the example for which "Performed" is listed in the column of "First circulation", a recirculation filtration treatment was performed in which the substance to be purified stored in the storage tank was filtered through the filters 4 and 5 described in Table 1, circulated to the upstream side of the filter 4 after being filtered through the filter 5, and then filtered again through the filters 4 and 5. After the recirculation filtration treatment, the chemical liquid was stored in a container.

As shown in Table 1 which will be described later, in the example for which "N/A" is listed in the column of "First circulation", the substance to be purified stored in the storage tank was filtered through the filters 4 to 6 described in Table 1 without being subjected to the aforementioned circulation treatment.

Subsequently, as shown in Table 1 which will be described later, in the example for which "Performed" is listed in the column of "Second circulation", a recirculation filtration treatment was performed in which the obtained substance to be purified was filtered through the filter 7 described in Table 1, circulated to the upstream side of the filter 7 after being filtered through the filter 7, and filtered again through the filter 7. After the recirculation filtration treatment, the chemical liquid was stored in a container.

As shown in Table 1 which will be described later, in the example for which "N/A" is listed in the column of "Second circulation", the substance to be purified was filtered through the filter 7 described in Table 1 without being subjected to the aforementioned circulation treatment.

The liquid contact portion of various devices (such as a distillation column, piping, and a storage tank) coming into contact with the substance to be purified in the series of purification process described above was constituted with electropolished stainless steel.

The contents of the organic component and metal component in the chemical liquid were measured by the following method.

<Content of Organic Component>

The content of the organic component in the chemical liquid was measured using a gas chromatography mass spectrometry (GC/MS) (manufactured by Agilent Technologies, Inc., GC: 7890B, MS: 5977B E/CI MSD).

<Content of Sulfate Ion>

The content of a sulfate ion in the chemical liquid was measured by ion chromatography (for example, HIC-SP manufactured by Shimadzu Corporation).

<Content of Metal Component>

The content of the metal component (metal ions and metal particles) in the chemical liquid was measured by a method using ICP-MS and SP-ICP-MS.

The used devices are as follows.

Manufacturer: PerkinElmer

Model: NexION350S The following analysis software was used for analysis.

Syngistix nano application module dedicated for "SP-ICP-MS"

Syngistix for ICP-MS software

<Evaluation Method>

(Variation Evaluation)

First, a silicon substrate having a diameter of 300 mm was coated with an organic antireflection film-forming composition ARC29SR (manufactured by Nissan Chemical Corporation) and baked at 205° C. for 60 seconds, thereby forming an antireflection film having a film thickness of 78 nm.

In order to improve coating properties, a prewet solution (manufactured by FUJIFILM Electronic Materials Co., Ltd., cyclohexanone) was added dropwise to the surface of the antireflection film in the silicon substrate on which the antireflection film was formed, and spin coating was performed.

Then, the antireflection film was coated with an actinic ray-sensitive or radiation-sensitive resin composition 1 which will be described later and prebaked at 100° C. for 60 seconds, thereby forming a coating film having a film thickness of 150 nm.

Thereafter, by using an ArF excimer laser scanner (NA: 0.75), pattern exposure was performed on the coating film at 25 [mJ/cm²]. The substrate was then heated at 120° C. for 60 seconds. Thereafter, by using the chemical liquid of each example as a developer, puddle development was performed for 30 seconds. Subsequently, the silicon substrate was rotated at a rotation speed of 4,000 rpm for 30 seconds, thereby forming a negative resist pattern. The obtained negative resist pattern was then post-baked at 200° C. for 300 seconds. Through the above steps, an L/S pattern at line/space of 1:1 was obtained. The line width was 65 nm.

(Actinic Ray-Sensitive or Radiation-Sensitive Resin Composition 1)

Acid-decomposable resin (resin represented by the following formula (weight-average molecular weight (Mw): 7,500): the numerical value described in each repeating unit means mol %): 100 parts by mass

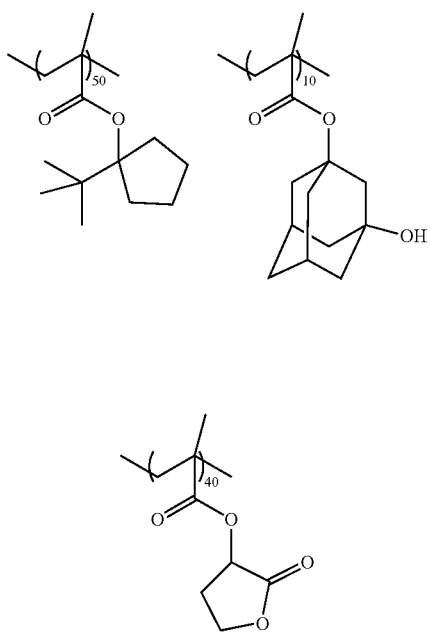

The following photoacid generator: 8 parts by mass

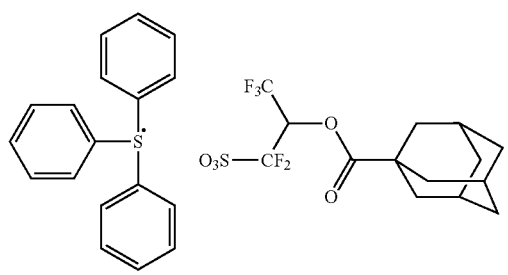

The following quencher: 5 parts by mass (the mass ratio was 0.1:0.3:0.3:0.2 in this order from the left).

Among the following quenchers, a polymer-type quencher has a weight-average molecular weight (Mw) of 5,000. The numerical value described in each repeating unit means molar ratio.

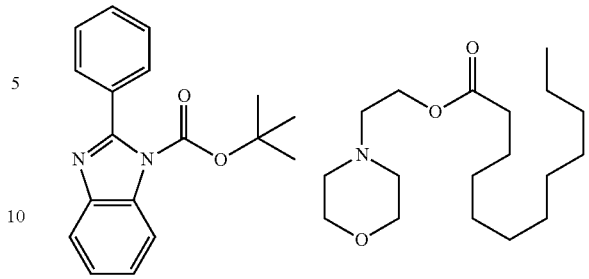

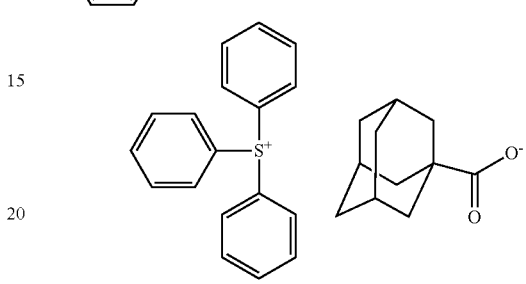

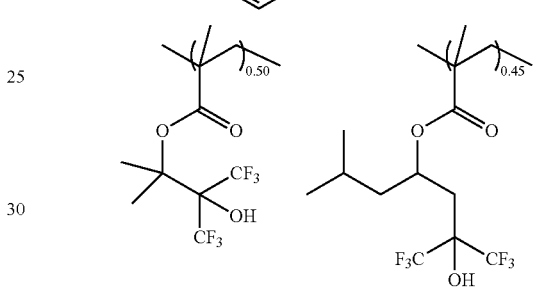

The following hydrophobic resins: 4 parts by mass (the mass ratio was 0.5:0.5 in this order from the left).

Among the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described in each repeating unit means molar ratio.

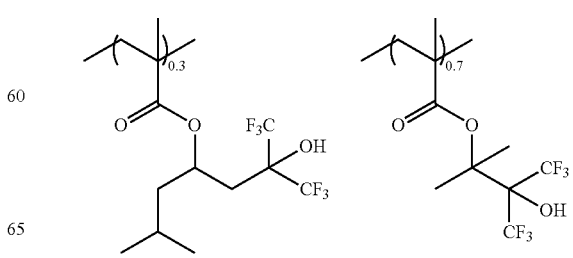

-continued

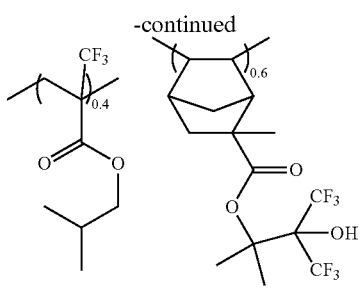

Solvent:
Propylene glycol monomethyl ether acetate (PGMEA): 3 parts by mass
Cyclohexanone: 600 parts by mass
γ-Butyrolactone (γ-BL): 100 parts by mass The L/S pattern obtained as above was observed and evaluated according to the following standard. Pattern intervals were measured for 100 patterns, an arithmetic mean thereof was calculated, and a "difference" between the arithmetic mean and the value farthest from the arithmetic mean was calculated. The difference was divided by the arithmetic mean and multiplied by 100, and the obtained value (%) was adopted as a pattern interval variation.

"AA": The variation was less than 0.5%.
"A": The variation was higher than 0.5% and equal to or less than 1.0%.
"B": The variation was higher than 1.0% and equal to or less than 1.2%.
"C": The variation was higher than 1.2% and equal to or less than 1.5%.
"D": The variation was higher than 1.5% and equal to or less than 2.0%.
"E": The variation was higher than 2.0% and equal to or less than 2.5%.
"F": The variation was higher than 2.5% and equal to or less than 3.0%.
"G": The variation was higher than 3.0%.

(Evaluation Over Time)

The chemical liquid was stored at 30° C. for 1 year. Then, the stored chemical liquid was subjected to (Variation evaluation) described above and evaluated according to the following standard.

"A": A difference between the result of the variation evaluation using the chemical liquid before storage and the result of the variation evaluation using the chemical liquid after storage (value of variation evaluated using chemical liquid after storage–value of variation evaluated using chemical liquid before storage) was less than 3.0%.

"B": A difference between the result of the variation evaluation using the chemical liquid before storage and the result of the variation evaluation using the chemical liquid after storage (value of variation evaluated using chemical liquid after storage–value of variation evaluated using chemical liquid before storage) was equal to or higher than 3.0% and less than 5.0%.

"C": A difference between the result of the variation evaluation using the chemical liquid before storage and the result of the variation evaluation using the chemical liquid after storage (value of variation evaluated using chemical liquid after storage–value of variation evaluated using chemical liquid before storage) was equal to or higher than 5.0%.

In Table 1, "Ratio 1 (isobutyl acetate/pentyl acetates)" represents the mass ratio of the content of isobutyl acetate to the content of pentyl acetates.

"Ratio 2 (propionic acid butyl ester/pentyl acetates)" represents the mass ratio of the content of propionic acid butyl ester to the content of pentyl acetates.

"Ratio 3 (dibutyl ether/pentyl acetates)" represents the mass ratio of the content of dibutyl ether to the content of pentyl acetates.

"Ratio 4 (sulfate ion/pentyl acetates)" represents the mass ratio of the content of a sulfate ion to the content of pentyl acetates.

"Ratio 5 (sulfate ion/metal component)" represents the mass ratio of the content of a sulfate ion to the content of a metal component.

"Ratio 6 (isobutyl acetate/metal component)" represents the mass ratio of the content of isobutyl acetate to the content of a metal component.

In Table 1, "<0.5" means the number is less than 0.5. Furthermore, ">X" means that the number is greater than X.
In Table 1, "E+number" represents "$10^{number}$".

TABLE 1

| Table 1-1 | Raw material | Purification device Distillation and purification | Filter 1 | Filter 2 | Filter 3 |
|---|---|---|---|---|---|
| Example 1 | Mitsubishi Chemical Corporation. | Performed-1 | PTFE 200 nm | PTFE 100 nm | PTFE 50 nm |
| Example 2 | Mitsubishi Chemical Corporation. | Performed-2 | PTFE 200 nm | PTFE 100 nm | PTFE 50 nm |
| Example 3 | Mitsubishi Chemical Corporation. | Performed-3 | PTFE 200 nm | PTFE 100 nm | PTFE 50 nm |
| Example 4 | Mitsubishi Chemical Corporation. | Performed-4 | PTFE 200 nm | PTFE 100 nm | PTFE 50 nm |
| Example 5 | Mitsubishi Chemical Corporation. | Performed-5 | PTFE 200 nm | PTFE 100 nm | PTFE 50 nm |
| Example 6 | Mitsubishi Chemical Corporation. | Performed-6 | PTFE 200 nm | PTFE 100 nm | PTFE 50 nm |
| Example 7 | SHOWA DENKO K.K. | Performed-7 | PTFE 200 nm | PTFE 100 nm | PTFE 50 nm |
| Example 8 | SHOWA DENKO K.K. | Performed-8 | PTFE 200 nm | PTFE 100 nm | PTFE 50 nm |
| Example 9 | SHOWA DENKO K.K. | Performed-9 | PTFE 200 nm | PTFE 100 nm | PTFE 50 nm |
| Example 10 | KANTO CHEMICAL CO., INC. | Performed-1 | PTFE 200 nm | PTFE 100 nm | PTFE 50 nm |

TABLE 1-continued

| Table 1-1 | Raw material | Purification device Distillation and purification | Filter 1 | Filter 2 | Filter 3 |
|---|---|---|---|---|---|
| Example 11 | BASF | Performed-1 | PTFE 200 nm | PTFE 100 nm | PTFE 50 nm |
| Example 12 | ENF | Performed 1 | PTFE 200 nm | PTFE 100 nm | PTFE 50 nm |
| Example 13 | Toyo Gosei Co., Ltd | Performed-1 | PTFE 200 nm | PTFE 100 nm | PTFE 50 nm |
| Example 14 | EWG | Performed-2 | PTFE 200 nm | PTFE 100 nm | PTFE 50 nm |
| Example 15 | Mainchem Co., Ltd. | Performed-3 | PTFE 200 nm | PTFE 100 nm | PTFE 50 nm |
| Example 16 | SHOWA DENKO K.K. | Performed-5 | PTFE 500 nm | PTFE 200 nm | PTFE 100 nm |
| Example 17 | SHOWA DENKO K.K. | Performed-5 | PTFE 200 nm | PTFE 100 nm | PTFE 50 nm |
| Example 18 | SHOWA DENKO K.K. | Performed-5 | PTFE 200 nm | PTFE 100 nm | PTFE 50 nm |
| Example 19 | SHOWA DENKO K.K. | Performed-5 | PTFE 200 nm | PTFE 100 nm | PTFE 50 nm |
| Example 20 | SHOWA DENKO K.K. | Performed-5 | PTFE 200 nm | PTFE 100 nm | PTFE 50 nm |
| Example 21 | SHOWA DENKO K.K. | Performed-1 | PTFE 200 nm | PTFE 100 nm | PTFE 50 nm |
| Example 22 | SHOWA DENKO K.K. | Performed-2 | PTFE 200 nm | PTFE 100 nm | PTFE 50 nm |
| Example 23 | BASF | Performed 1 | PTFE 200 nm | PTFE 100 nm | PTFE 50 nm |
| Example 24 | EWG | Performed-1 | PTFE 200 nm | PTFE 100 nm | PTFE 50 nm |
| Example 25 | SHOWA DENKO K.K. | Performed-4 | PTFE 200 nm | PTFE 100 nm | PTFE 50 nm |
| Comparative Example 1 | SHOWA DENKO K.K. | Performed-5 | PTFE 200 nm | PTFE 50 nm | PTFE 20 nm |
| Comparative Example 2 | SHOWA DENKO K.K. | N/A | PTFE 200 nm | PTFE 100 nm | PTFE 50 nm |

TABLE 2

| Table 1-2 | Filter 4 | Filter 5 | Filter 6 | First circulation | Filter 7 | Second circulation |
|---|---|---|---|---|---|---|
| Example 1 | PTFE 20 nm | PTFE 10 nm | | Performed | | N/A |
| Example 2 | PTFE 20 nm | PTFE 10 nm | | Performed | | N/A |
| Example 3 | PTFE 20 nm | PTFE 10 nm | | Performed | | N/A |
| Example 4 | PTFE 20 nm | PTFE 10 nm | | Performed | | N/A |
| Example 5 | PTFE 20 nm | PTFE 10 nm | | Performed | | N/A |
| Example 6 | PTFE 20 nm | PTFE 10 nm | | Performed | | N/A |
| Example 7 | PTFE 20 nm | PTFE 10 nm | | Performed | | N/A |
| Example 8 | PTFE 20 nm | PTFE 10 nm | | Performed | | N/A |
| Example 9 | PTFE 20 nm | PTFE 10 nm | | Performed | | N/A |
| Example 10 | PTFE 20 nm | PTFE 10 nm | | Performed | | N/A |
| Example 11 | PTFE 20 nm | PTFE 10 nm | | Performed | | N/A |
| Example 12 | PTFE 20 nm | PTFE 10 nm | | Performed | | N/A |
| Example 13 | PTFE 20 nm | PTFE 10 nm | | Performed | | N/A |
| Example 14 | PTFE 20 nm | PTFE 10 nm | | Performed | | N/A |
| Example 15 | PTFE 20 nm | PTFE 10 nm | | Performed | | N/A |
| Example 16 | PTFE 20 nm | PTFE 10 nm | | Performed | | N/A |
| Example 17 | PTFE 10 nm | PTFE 5 nm | | Performed | | N/A |
| Example 18 | PP 200 nm | IEX | PTFE 10 nm | N/A | UPE 3 nm | N/A |
| Example 19 | PP 200 nm | IEX | PTFE 10 nm | N/A | Nylon 5 nm | N/A |
| Example 20 | PP 200 nm | IEX | PTFE 10 nm | N/A | UPE 3 nm | N/A |
| Example 21 | PTFE 10 nm | PTFE 5 nm | | Performed | | N/A |
| Example 22 | PTFE 10 nm | PTFE 5 nm | | Performed | | N/A |
| Example 23 | PTFE 10 nm | PTFE 5 nm | | Performed | | N/A |

TABLE 2-continued

| Table 1-2 | Purification device | | | | | |
|---|---|---|---|---|---|---|
| | Filter 4 | Filter 5 | Filter 6 | First circulation | Filter 7 | Second circulation |
| Example 24 | PTFE 10 nm | PTFE 5 nm | | Performed | | N/A |
| Example 25 | PTFE 10 nm | PTFE 5 nm | | Performed | | N/A |
| Comparative Example 1 | PTFE 10 nm | PTFE 7 nm | PTFE 5 nm | Performed | Nylon 5 nm | Performed |
| Comparative Example 2 | PTFE 20 nm | PTFE 10 nm | | N/A | | N/A |

TABLE 3

| Table 1-3 | Chemical liquid | | | | | |
|---|---|---|---|---|---|---|
| | n-Butyl acetate (% by mass) | Isobutyl acetate (mass ppm) | 1-Methylbutyl acetate (mass ppm) | 2-Methylbutyl acetate (mass ppm) | 3-Methylbutyl acetate (mass ppm) | Propionic acid butyl ester (mass ppm) |
| Example 1 | 99.98 | 2.0 | <0.5 | <0.5 | 1.0 | <0.5 |
| Example 2 | 99.98 | 30 | <0.5 | <0.5 | 3.0 | <0.5 |
| Example 3 | 99.98 | 50 | <0.5 | <0.5 | 5.0 | <0.5 |
| Example 4 | 99.98 | 100 | <0.5 | <0.5 | 10 | 1.0 |
| Example 5 | 99.98 | 400 | <0.5 | <0.5 | 40 | 3.0 |
| Example 6 | 99.98 | 500 | <0.5 | <0.5 | 50 | 3.8 |
| Example 7 | 99.98 | 600 | <0.5 | <0.5 | 80 | 4.5 |
| Example 8 | 99.98 | 800 | <0.5 | <0.5 | 40 | 6.0 |
| Example 9 | 99.98 | 950 | <0.5 | <0.5 | 70 | 7.1 |
| Example 10 | 99.98 | 415 | 45 | 15 | 20 | 100 |
| Example 11 | 99.98 | 650 | <0.5 | <0.5 | 2.0 | 300 |
| Example 12 | 99.98 | 430 | 500 | 85 | 100 | 200 |
| Example 13 | 99.98 | 420 | 1,500 | 200 | 3.0 | 750 |
| Example 14 | 99.98 | 440 | <0.5 | 180 | 20 | 1,050 |
| Example 15 | 99.98 | 500 | <0.5 | 35 | 50 | <0.5 |
| Example 16 | 99.98 | 410 | <0.5 | <0.5 | 45 | 5.0 |
| Example 17 | 99.98 | 410 | <0.5 | <0.5 | 20 | 8.0 |
| Example 18 | 99.98 | 400 | 20 | 20 | 90 | 300 |
| Example 19 | 99.98 | 410 | <0.5 | <0.5 | 13 | 6.0 |
| Example 20 | 99.98 | 450 | <0.5 | <0.5 | 31 | 7.0 |
| Example 21 | 99.98 | 400 | 174 | 39 | 23 | 310 |
| Example 22 | 99.98 | 480 | <0.5 | <0.5 | 4.5 | 2.6 |
| Example 23 | 99.98 | 490 | <0.5 | 29 | 2.6 | 280 |
| Example 24 | 99.98 | 930 | 33 | 170 | 93 | 620 |
| Example 25 | 99.98 | 680 | <0.5 | 2.5 | <0.5 | 4.6 |
| Comparative Example 1 | 99.98 | 0.5 | <0.5 | <0.5 | 20 | 4.0 |
| Comparative Example 2 | 99.98 | 1,050 | <0.5 | <0.5 | 15 | 5.0 |

TABLE 4

| Table 1-4 | Chemical liquid | | | | | | |
|---|---|---|---|---|---|---|---|
| | 1-Butanol (ppm) | Butyl formate (mass ppm) | Dibutyl ether (mass ppm) | Sulfate ion (mass ppm) | Content of metal ions (mass ppt) | Content of metal particles (mass ppt) | Content of metal component (mass ppt) |
| Example 1 | 30 | 1.0 | 2.0 | 2.0 | 4 | 3 | 7 |
| Example 2 | 90 | 1.0 | 1.3 | 3.0 | 4 | 2 | 6 |
| Example 3 | 150 | 1.0 | 19 | 2.0 | 2 | 1 | 3 |
| Example 4 | 300 | 1.0 | 38 | 120 | 13 | 8 | 21 |
| Example 5 | 1,200 | 1.0 | 150 | 10 | 52 | 32 | 84 |
| Example 6 | 1,500 | 1.0 | 188 | 13 | 65 | 40 | 105 |
| Example 7 | 2,400 | 1.0 | 225 | 2.0 | 78 | 48 | 126 |
| Example 8 | 1,200 | 1.0 | 300 | 15 | 104 | 64 | 168 |
| Example 9 | 2,100 | 1.0 | 356 | 15 | 124 | 76 | 200 |
| Example 10 | 600 | 60 | 70 | 20 | 54 | 33 | 87 |
| Example 11 | 60 | 5.0 | 1,300 | 45 | 85 | 52 | 137 |
| Example 12 | 3,000 | 40 | 500 | 85 | 56 | 34 | 90 |
| Example 13 | 90 | 2.0 | 1,600 | 90 | 55 | 34 | 88 |
| Example 14 | 600 | <0.5 | 150 | 210 | 57 | 35 | 8 |
| Example 15 | 1,500 | <0.5 | 3,200 | 0.6 | 65 | 40 | 105 |

TABLE 4-continued

| Table 1-4 | 1-Butanol (ppm) | Butyl formate (mass ppm) | Dibutyl ether (mass ppm) | Sulfate ion (mass ppm) | Content of metal ions (mass ppt) | Content of metal particles (mass ppt) | Content of metal component (mass ppt) |
|---|---|---|---|---|---|---|---|
| Example 16 | 4 | 1.0 | 120 | 20 | 21.0 | 30.0 | 51.0 |
| Example 17 | 3,650 | 1.0 | 150 | 25 | 35.0 | 12.3 | 47.3 |
| Example 18 | 2,700 | 1.0 | 390 | 13 | 10 | 32 | 42 |
| Example 19 | 390 | 1.0 | 120 | 30 | 0.006 | 0.002 | 0.008 |
| Example 20 | 930 | 1.0 | 130 | 15 | 2.0 | 0.7 | 2.7 |
| Example 21 | 15 | 1.0 | 340 | 20 | 52 | 32 | 84 |
| Example 22 | 890 | 20.0 | 150 | 15 | 62 | 38 | 101 |
| Example 23 | 2,600 | 25.0 | 130 | 13 | 64 | 39 | 103 |
| Example 24 | 8 | 48.0 | 290 | 30 | 76 | 44 | 120 |
| Example 25 | 7.8 | 36.0 | 72 | 15 | 65 | 32 | 97 |
| Comparative Example 1 | 600 | 1.0 | 90 | 20 | 0.005 | 0.002 | 0.007 |
| Comparative Example 2 | 450 | 1.0 | 180 | 20 | 289.0 | 101.2 | 390.2 |

TABLE 5

| Table 1-5 | Ratio 1 (isobutyl acetate/ pentyl acetates) | Ratio 2 (propionic acid butyl ester/ pentyl acetates) | Ratio 3 (dibutyl ether/ pentyl acetates) | Ratio 4 (sulfate ion/ pentyl acetates) | Ratio 5 (sulfate ion/ metal component) | Ratio 6 (isobutyl acetate/ metal component) |
|---|---|---|---|---|---|---|
| Example 1 | 2.0 | >10 | 2.00 | 2.00 | 2.86E+05 | 2.86E+05 |
| Example 2 | 10.0 | >10 | 0.43 | 1.00 | 4.76E+05 | 4.76E+06 |
| Example 3 | 10.0 | >10 | 3.75 | 0.40 | 6.67E+05 | 1.67E+07 |
| Example 4 | 10.0 | 0.10 | 3.75 | 12.0 | 5.71E+06 | 4.76E+06 |
| Example 5 | 10.0 | 0.08 | 3.75 | 0.25 | 1.19E+05 | 4.76E+06 |
| Example 6 | 10.0 | 0.08 | 3.75 | 0.26 | 1.24E+05 | 4.76E+06 |
| Example 7 | 7.5 | 0.06 | 2.81 | 0.03 | 1.59E+04 | 4.76E+06 |
| Example 8 | 20.0 | 0.15 | 7.50 | 0.38 | 8.93E+04 | 4.76E+06 |
| Example 9 | 13.6 | 0.10 | 5.09 | 0.21 | 7.52E+04 | 4.76E+06 |
| Example 10 | 5.2 | 1.25 | 0.88 | 0.25 | 2.29E+05 | 4.76E+06 |
| Example 11 | 325.0 | 150 | 650 | 22.5 | 3.30E+05 | 4.76E+06 |
| Example 12 | 0.6 | 0.29 | 0.73 | 0.12 | 9.41E+05 | 4.76E+06 |
| Example 13 | 0.2 | 0.44 | 0.94 | 0.05 | 1.02E+06 | 4.76E+06 |
| Example 14 | 2.2 | 5.25 | 0.75 | 1.05 | 2.63E+07 | 5.50E+07 |
| Example 15 | 5.9 | >10 | 37.6 | 0.007 | 5.71E+03 | 4.76E+06 |
| Example 16 | 9.1 | 0.11 | 2.67 | 0.44 | 3.92E+05 | 8.04E+06 |
| Example 17 | 20.5 | 0.40 | 7.50 | 1.25 | 5.29E+05 | 8.68E+06 |
| Example 18 | 3.1 | 2.31 | 3.00 | 0.10 | 3.10E+05 | 9.52E+06 |
| Example 19 | 31.5 | 0.46 | 9.23 | 2.31 | 3.70E+09 | 5.06E+10 |
| Example 20 | 14.5 | 0.23 | 4.19 | 0.48 | 5.56E+06 | 1.67E+08 |
| Example 21 | 1.7 | 1.31 | 1.44 | 0.08 | 2.38E+05 | 4.76E+06 |
| Example 22 | 106.7 | 0.58 | 33.3 | 3.33 | 1.49E+05 | 4.76E+06 |
| Example 23 | 15.5 | 8.86 | 4.11 | 0.41 | 1.26E+05 | 4.76E+06 |
| Example 24 | 3.1 | 2.09 | 0.98 | 0.10 | 2.50E+05 | 7.75E+06 |
| Example 25 | 272.0 | 1.84 | 28.8 | 6.00 | 1.55E+05 | 7.01E+06 |
| Comparative Example 1 | 0.0 | 0.20 | 4.50 | 1.00 | 2.96E+09 | 7.41E+07 |
| Comparative Example 2 | 70.0 | 0.33 | 12.00 | 1.33 | 5.13E+04 | 2.69E+06 |

TABLE 6

| Table 1-6 | Container Type | Void volume (% by volume) | Evaluation Variation evaluation | Evaluation over time |
|---|---|---|---|---|
| Example 1 | EP-SUS | 5 | C | A |
| Example 2 | EP-SUS | 5 | D | A |
| Example 3 | EP-SUS | 5 | C | A |
| Example 4 | EP-SUS | 35 | A | B |
| Example 5 | EP-SUS | 5 | A | A |
| Example 6 | EP-SUS | 5 | A | A |
| Example 7 | EP-SUS | 5 | A | B |
| Example 8 | EP-SUS | 5 | A | A |
| Example 9 | EP-SUS | 5 | A | A |
| Example 10 | PFA | 5 | A | A |
| Example 11 | EP-SUS | 5 | D | A |
| Example 12 | EP-SUS | 3 | A | B |
| Example 13 | EP-SUS | 5 | D | A |
| Example 14 | EP-SUS | 5 | D | A |
| Example 15 | EP-SUS | 5 | F | A |
| Example 16 | EP-SUS | 5 | A | A |

TABLE 6-continued

| Table 1-6 | Container Type | Void volume (% by volume) | Evaluation Variation evaluation | Evaluation over time |
|---|---|---|---|---|
| Example 17 | EP-SUS | 5 | A | A |
| Example 18 | EP-SUS | 5 | AA | A |
| Example 19 | EP-SUS | 5 | C | A |
| Example 20 | EP-SUS | 5 | A | A |
| Example 21 | EP-SUS | 5 | AA | A |
| Example 22 | EP-SUS | 5 | AA | A |
| Example 23 | EP-SUS | 5 | AA | A |
| Example 24 | EP-SUS | 5 | AA | A |
| Example 25 | EP-SUS | 5 | AA | A |
| Comparative Example 1 | EP-SUS | 1 | G | C |
| Comparative Example 2 | EP-SUS | 40 | G | C |

In Table 1, the data relating to each of the examples and comparative examples is shown in each row of Table 1-1 to Table 1-6.

For example, in Example 1, "PTFE 200 nm" was used as the filter 1 as shown in Table 1-1, "PTFE 20 nm" was used as the filter 4 as shown in Table 1-2, the content of isobutyl acetate in the chemical liquid was 2.0 mass ppm as shown in Table 1-3, the content of 1-butanol in the chemical liquid was 30 mass ppm as shown in Table 1-4, the ratio 1 (isobutyl acetate/pentyl acetates) was 2.0 as shown in Table 1-5, and the result of the variation evaluation was "C" as shown in Table 1-6. For other examples and comparative examples, the data is interpreted in the same manner.

As shown in Table 1, it has been confirmed that the desired effects can be obtained in a case where the chemical liquid according to an embodiment of the present invention is used.

Particularly, from the comparison of Examples 4 and 12 and other examples, it has been confirmed that the result of the evaluation over time is better in a case where the void volume is 5% to 30% by volume.

Furthermore, as shown in Examples 5 and 18, it has been confirmed that the effect is further improved in a case where all of the following requirements 1 to 12 are satisfied.

In addition, as shown in other examples, in a case where any one of the requirements 1 to 12 was not satisfied, the result of (Variation evaluation) was "A"; in a case where two of the requirements 1 to 12 were not satisfied, the result of (Variation evaluation) was "B"; in a case where three of the requirements 1 to 12 were not satisfied, the result of (Variation evaluation) was "C"; in a case where four of the requirements 1 to 12 were not satisfied, the result of (Variation evaluation) was "D"; in a case where five of the requirements 1 to 12 were not satisfied, the result of (Variation evaluation) was "E"; and in a case where six to eight of the requirements 1 to 12 were not satisfied, the result of (Variation evaluation) was "F".

Requirement 1: The content of pentyl acetates is 1.0 to 300 mass ppm with respect to the total mass of the chemical liquid.

Requirement 2: The content of propionic acid butyl ester is 1.0 to 700 mass ppm with respect to the total mass of the chemical liquid.

Requirement 3: The content of butyl formate is 1.0 to 50 mass ppm with respect to the total mass of the chemical liquid.

Requirement 4: The content of dibutyl ether is 5.0 to 500 mass ppm with respect to the total mass of the chemical liquid.

Requirement 5: The content of a sulfate ion is 1.0 to 200 mass ppm with respect to the total mass of the chemical liquid.

Requirement 6: The content of a metal component is 0.01 to 150 mass ppt with respect to the total mass of the chemical liquid.

Requirement 7: The mass ratio (ratio 1) of the content of isobutyl acetate to the content of pentyl acetates is 0.5 to 300.

Requirement 8: The mass ratio (ratio 2) of the content of propionic acid butyl ester to the content of pentyl acetates is 0.10 to 10.0.

Requirement 9: The mass ratio (ratio 3) of the content of dibutyl ether to the content of pentyl acetates is higher than 0.5 and equal to or lower than 35.0.

Requirement 10: The mass ratio (ratio 4) of the content of a sulfate ion to the content of pentyl acetates is 0.01 to 10.0.

Requirement 11: The mass ratio (ratio 5) of the content of a sulfate ion to the content of a metal component is $10^4$ to $10^8$.

Requirement 12: The mass ratio (ratio 6) of the content of isobutyl acetate to the content of a metal component is $10^4$ to $10^7$.

The inventors of the present invention examined the characteristics of the chemical liquid of JP2015-084122A. As a result, with the chemical liquid described in JP2015-084122A, a predetermined effect was not obtained.

Example 26

The chemical liquid was evaluated according to the same procedure as in (Variation evaluation) described above, except that in the aspect of Example 6, the resist pattern formed after development was washed using the chemical liquid of Example 6 as a rinsing solution and then post-baked. The result of the variation evaluation was "AA". From this result, it has been confirmed that the effects are further improved in a case where the step of using the chemical liquid according to an embodiment of the present invention as a rinsing solution is performed.

Example 27

The chemical liquid was evaluated according to the same procedure as in (Variation evaluation) described above, except that in the aspect of Example 6, the resist pattern formed after development was washed using a mixed solution of the chemical liquid (97% by mass) of Example 6 and 4-methyl-2-pentanol (3% by mass) as a rinsing solution and then post-baked. The result of the variation evaluation was "AA". From this result, it has been confirmed that the effects are further improved in a case where the step of using the chemical liquid according to an embodiment of the present invention as a rinsing solution is performed.

Examples 28 to 32

Various evaluations were performed according to the same procedure as in Examples 21 to 25, except that (Actinic ray-sensitive or radiation-sensitive resin composition 2) which will be described later was used instead of (Actinic ray-sensitive or radiation-sensitive resin composition 1).

In Examples 28 to 32, the results of (Variation evaluation) and (Evaluation over time) were "AA" and "A" respectively as in Examples 21 to 25. From this result, it has been confirmed that the same effect is obtained even though the actinic ray-sensitive or radiation-sensitive resin composition is changed.

<Actinic Ray-Sensitive or Radiation-Sensitive Resin Composition 2>

Acid-decomposable resin (resin represented by the following formula (weight-average molecular weight (Mw) 8,000): the numerical value described in each repeating unit means mol %): 100 parts by mass

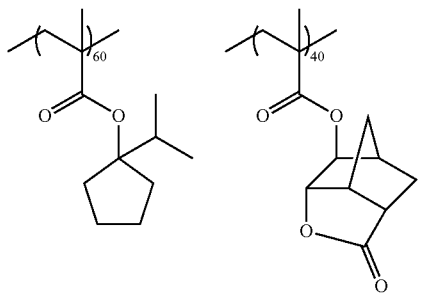

The following photoacid generator: 12 parts by mass (the mass ratio was 0.5:0.5 in this order from the left).

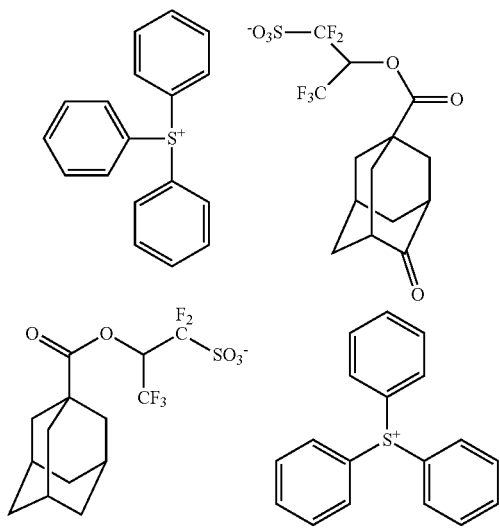

The following quencher: 5 parts by mass (the mass ratio was 0.3:0.7 in this order from the left).

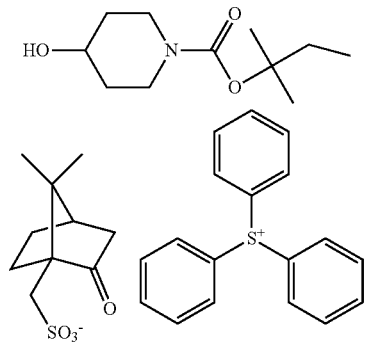

The following hydrophobic resins: 5 parts by mass (the mass ratio was 0.8:0.2 in this order from the top).

Among the following hydrophobic resins, the hydrophobic resin on the upper side has a weight-average molecular weight (Mw) of 8,000, and the hydrophobic resin on the lower side has a weight-average molecular weight (Mw) of 6,000. In each of the hydrophobic resins, the numerical value described in each repeating unit means molar ratio.

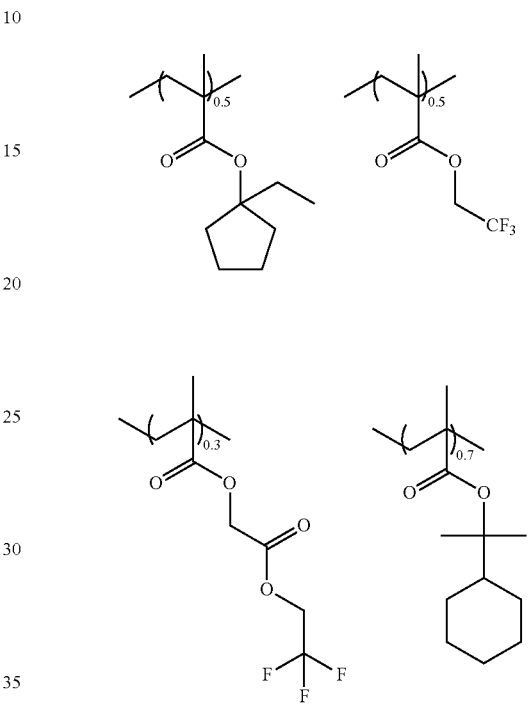

Solvent:

Propylene glycol monomethyl ether acetate (PGMEA): 3 parts by mass

Cyclohexanone: 600 parts by mass

γ-Butyrolactone (γ-BL): 100 parts by mass

Examples 33 to 37

Various evaluations were performed according to the same procedure as in Examples 21 to 25, except that (Actinic ray-sensitive or radiation-sensitive resin composition 3) which will be described later was used instead of (Actinic ray-sensitive or radiation-sensitive resin composition 1).

In Examples 33 to 37, the results of (Variation evaluation) and (Evaluation over time) were "AA" and "A" respectively as in Examples 21 to 25. From this result, it has been confirmed that the same effect is obtained even though the actinic ray-sensitive or radiation-sensitive resin composition is changed.

<Actinic Ray-Sensitive or Radiation-Sensitive Resin Composition 3>

Acid-decomposable resin (resin represented by the following formula (weight-average molecular weight (Mw) 8,000): the numerical value described in each repeating unit means mol %): 100 parts by mass

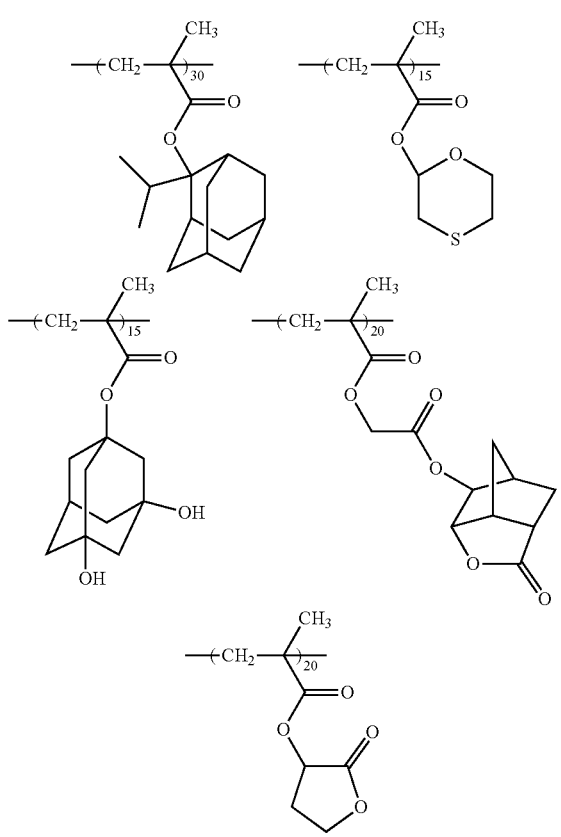

The following photoacid generator: 15 parts by mass

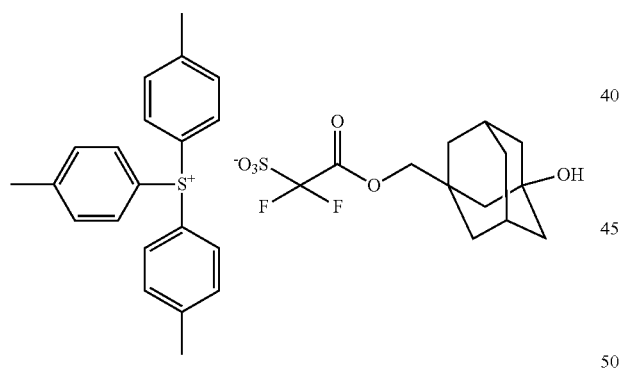

The following quencher: 7 parts by mass (the mass ratio was 1:1 in this order from the left).

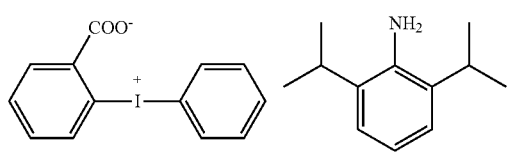

The following hydrophobic resins: 20 parts by mass (the mass ratio was 3:7 in this order from the top).

Among the following hydrophobic resins, the hydrophobic resin on the upper side has a weight-average molecular weight (Mw) of 10,000, and the hydrophobic resin on the lower side has a weight-average molecular weight (Mw) of 7,000. In the following hydrophobic resins, the molar ratio of repeating units is 0.67 and 0.33 in order from the left.

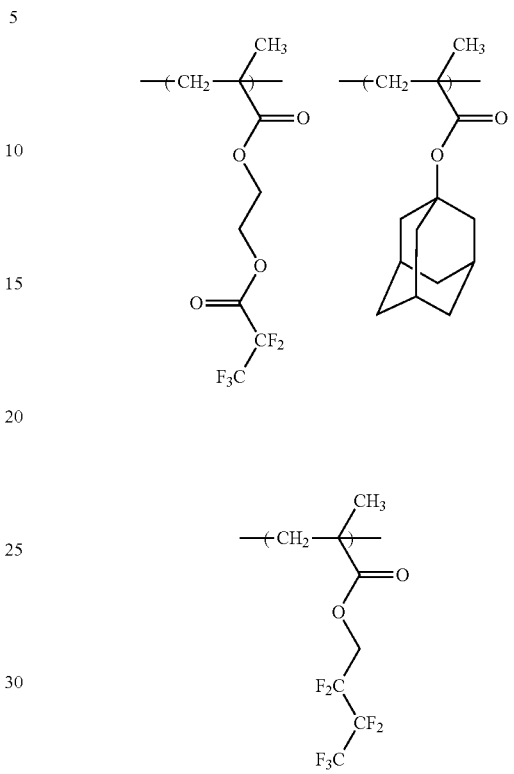

Solvent:

Propylene glycol monomethyl ether acetate (PGMEA): 50 parts by mass

PGME (propylene glycol monomethyl ether): 100 parts by mass

2-Heptanone: 100 parts by mass

γ-Butyrolactone (γ-BL): 500 parts by mass

Examples 38 to 42

Various evaluations were performed according to the same procedure as in Examples 21 to 25, except that (Actinic ray-sensitive or radiation-sensitive resin composition 4) which will be described later was used instead of (Actinic ray-sensitive or radiation-sensitive resin composition 1).

In Examples 38 to 42, the results of (Variation evaluation) and (Evaluation over time) were "AA" and "A" respectively as in Examples 21 to 25. From this result, it has been confirmed that the same effect is obtained even though the actinic ray-sensitive or radiation-sensitive resin composition is changed.

<Actinic Ray-Sensitive or Radiation-Sensitive Resin Composition 4>

Acid-decomposable resin (resin represented by the following formula (weight-average molecular weight (Mw) 6,500): the numerical value described in each repeating unit means mol %): 80 parts by mass

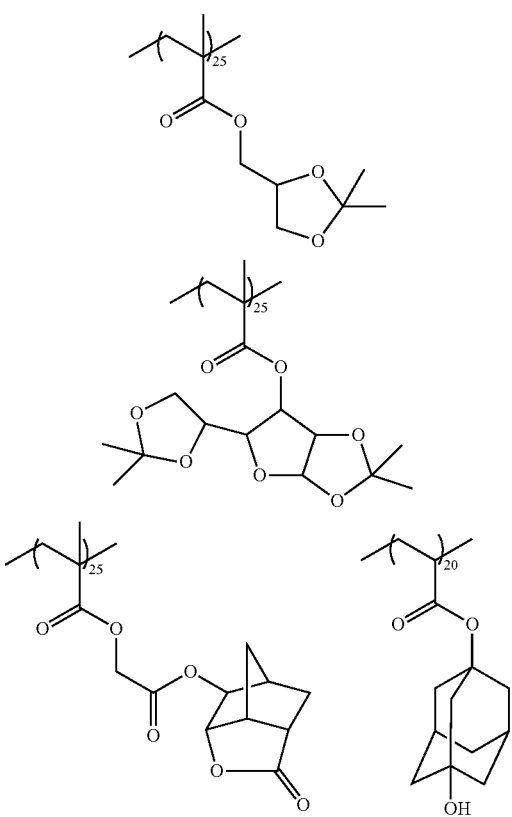

The following photoacid generator: 15 parts by mass

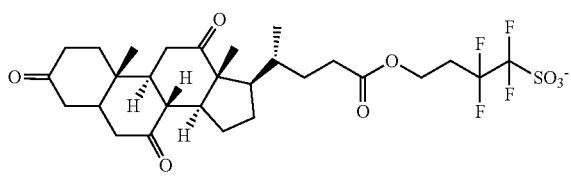

The following quencher: 5 parts by mass

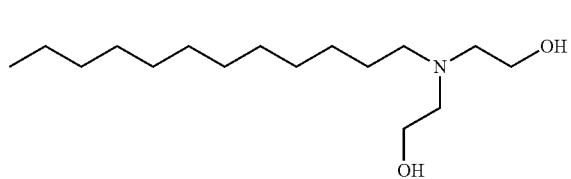 [SMILES: CCCCCCCCCCCCN(CCO)CCO]

The following hydrophobic resin (weight-average molecular weight (Mw) 5,000): 60 parts by mass

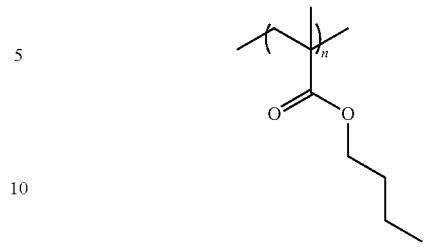

Solvent:
Propylene glycol monomethyl ether acetate (PGMEA): 70 parts by mass
Methyl-2-Hydroxybutyrate (HBM): 100 parts by mass
Cyclohexanone: 700 parts by mass Examples 43 to 47

Various evaluations were performed according to the same procedure as in Examples 21 to 25, except that (Actinic ray-sensitive or radiation-sensitive resin composition 5) which will be described later was used instead of (Actinic ray-sensitive or radiation-sensitive resin composition 1).

The acid-decomposable resin used in (Actinic ray-sensitive or radiation-sensitive resin composition 5) does not correspond to a resin including the repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

The obtained result of (Variation evaluation) was poorer in Examples 43 to 47 than in Examples 21 to 25. More specifically, in Examples 43 to 47, the result of (Variation evaluation) was A.

<Actinic Ray-Sensitive or Radiation-Sensitive Resin Composition 5>

Acid-decomposable resin (resin represented by the following formula (weight-average molecular weight (Mw): 6,500): the content of each repeating unit was 20 mol % and 80 mol % in this order from the left): 0.78 g

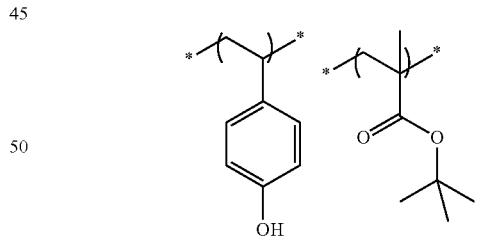

The following photoacid generator: 0.19 g

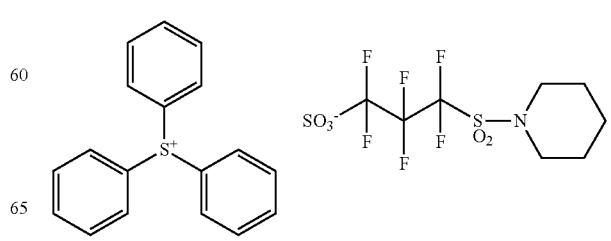

The following quencher: 0.03 g

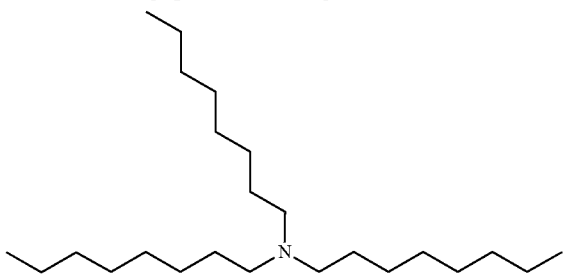 [SMILES: CCCCCCCCN(CCCCCCCC)CCCCCCCC]

Solvent:
Propylene glycol monomethyl ether acetate: 67.5 g
Ethyl lactate: 7.5 g

What is claimed is:

1. A chemical liquid comprising:
pentyl acetates;
n-butyl acetate; and
isobutyl acetate,
wherein a content of the n-butyl acetate is 99.000% to 99.999% by mass with respect to a total mass of the chemical liquid, and
a content of the isobutyl acetate is 1.0 to 1,000 mass ppm with respect to the total mass of the chemical liquid.

2. The chemical liquid according to claim 1,
wherein a content of the pentyl acetates is 1.0 to 300 mass ppm with respect to the total mass of the chemical liquid.

3. The chemical liquid according to claim 2,
wherein the pentyl acetates contain a compound selected from the group consisting of 1-methylbutyl acetate, 2-methylbutyl acetate, and 3-methylbutyl acetate.

4. The chemical liquid according to claim 2,
wherein a mass ratio of the content of the isobutyl acetate to the content of the pentyl acetates is 0.5 to 300.

5. The chemical liquid according to any claim 1, further comprising:
propionic acid butyl ester,
wherein a content of the propionic acid butyl ester is 1.0 to 700 mass ppm with respect to the total mass of the chemical liquid.

6. The chemical liquid according to claim 5,
wherein a mass ratio of the content of the propionic acid butyl ester to a content of the pentyl acetates is 0.10 to 10.0.

7. The chemical liquid according to claim 1, further comprising:
butyl formate,
wherein a content of the butyl formate is 1.0 to 50 mass ppm with respect to the total mass of the chemical liquid.

8. The chemical liquid according to claim 1, further comprising:
dibutyl ether,
wherein a content of the dibutyl ether is 5.0 to 500 mass ppm with respect to the total mass of the chemical liquid.

9. The chemical liquid according to claim 8,
wherein a mass ratio of the content of the dibutyl ether to a content of the pentyl acetates is higher than 0.5 and equal to or lower than 35.0.

10. The chemical liquid according to claim 1, further comprising:
1-butanol,
wherein a content of the 1-butanol is 5.0 to 3,500 mass ppm with respect to the total mass of the chemical liquid.

11. The chemical liquid according to claim 1, further comprising:
a sulfate ion,
wherein a content of the sulfate ion is 1.0 to 200 mass ppm with respect to the total mass of the chemical liquid.

12. The chemical liquid according to claim 11,
wherein a mass ratio of the content of the sulfate ion to a content of the pentyl acetates is 0.01 to 10.0.

13. The chemical liquid according to claim 1, further comprising:
a metal component,
wherein a content of the metal component is 0.01 to 150 mass ppt with respect to the total mass of the chemical liquid.

14. The chemical liquid according to claim 13,
wherein a mass ratio of the content of the isobutyl acetate to the content of the metal component is $10^4$ to $10^7$.

15. The chemical liquid according to claim 1, further comprising:
a sulfate ion; and
a metal component,
wherein a mass ratio of a content of the sulfate ion to a content of the metal component is $10^4$ to $10^8$.

16. The chemical liquid according to claim 1, which is used as a developer or a rinsing solution.

17. A chemical liquid storage body comprising:
a container; and
the chemical liquid according to claim 1 that is stored in the container.

18. The chemical liquid storage body according to claim 17,
wherein a liquid contact portion coming into contact with the chemical liquid in the container is formed of electropolished stainless steel or a fluororesin.

19. The chemical liquid storage body according to claim 17,
wherein a void volume in the container determined by Equation (1) is 5% to 30% by volume, void volume={1−(volume of chemical liquid in container/container volume)}×100.　　　Equation (1):

20. A resist pattern forming method, comprising:
a step of forming a coating film on a substrate by using an actinic ray-sensitive or radiation-sensitive resin composition;
a step of exposing the coating film; and
a step of forming a resist pattern by developing the exposed coating film by using a developer,
wherein the developer is the chemical liquid according to claim 1.

21. A resist pattern forming method, comprising:
a step of forming a coating film on a substrate by using an actinic ray-sensitive or radiation-sensitive resin composition;
a step of exposing the coating film;
a step of forming a resist pattern by developing the exposed coating film by using a developer, and
a step of washing the resist pattern by using a rinsing solution,
wherein the rinsing solution is the chemical liquid according to claim 1.

22. A semiconductor chip manufacturing method comprising:
the resist pattern forming method according to claim 20.

* * * * *